(12) United States Patent
Mitsuno et al.

(10) Patent No.: US 12,041,778 B2
(45) Date of Patent: Jul. 16, 2024

(54) SEMICONDUCTOR STORAGE DEVICE AND METHOD FOR MANUFACTURING SEMICONDUCTOR STORAGE DEVICE

(71) Applicant: Kioxia Corporation, Tokyo (JP)

(72) Inventors: Yosuke Mitsuno, Mie (JP); Tatsufumi Hamada, Aichi (JP); Shinichi Sotome, Mie (JP); Tomohiro Kuki, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 512 days.

(21) Appl. No.: 17/464,173

(22) Filed: Sep. 1, 2021

(65) Prior Publication Data
US 2022/0302138 A1 Sep. 22, 2022

(30) Foreign Application Priority Data
Mar. 17, 2021 (JP) ................................ 2021-043362

(51) Int. Cl.
| | | |
|---|---|---|
| H10B 43/35 | (2023.01) | |
| G11C 16/04 | (2006.01) | |
| H10B 43/10 | (2023.01) | |
| H10B 43/20 | (2023.01) | |

(52) U.S. Cl.
CPC ......... H10B 43/35 (2023.02); G11C 16/0483 (2013.01); H10B 43/10 (2023.02); H10B 43/20 (2023.02)

(58) Field of Classification Search
None
See application file for complete search history.

(56) References Cited

U.S. PATENT DOCUMENTS

| | | | | |
|---|---|---|---|---|
| 10,115,681 | B1 * | 10/2018 | Ariyoshi | ............... H10B 43/10 |
| 10,665,607 | B1 * | 5/2020 | Sugiura | .................. H10B 43/50 |
| 11,404,427 | B2 * | 8/2022 | Otsu | ...................... H10B 43/10 |

(Continued)

FOREIGN PATENT DOCUMENTS

| | | |
|---|---|---|
| JP | 2012-015517 A | 1/2012 |
| TW | 202013619 A | 4/2020 |

*Primary Examiner* — Evren Seven
(74) *Attorney, Agent, or Firm* — Foley & Lardner LLP

(57) ABSTRACT

A semiconductor storage device includes a first stacked body, a second stacked body, an intermediate insulating layer, and a plurality of columnar bodies. The intermediate insulating layer is located between a first stacked body and a second stacked body and has a thickness in the stacking direction larger than that of one insulating layer in the plurality of insulating layers of the first stacked body. The plurality of columnar bodies are provided over the first stacked body and the second stacked body, and each columnar body includes a semiconductor body, a charge storage film provided between at least one of the plurality of conductive layers and the semiconductor body, and a semiconductor film. Each of the plurality of columnar bodies include a first columnar portion formed in the first stacked body, a second columnar portion formed in the intermediate insulating layer, and a third columnar portion formed in the second stacked body. A width of the semiconductor film in the second columnar portion in a direction intersecting the stacking direction is the shortest at an upper end of the intermediate columnar portion and the longest at a lower end of the intermediate columnar portion.

15 Claims, 19 Drawing Sheets

(56) References Cited

U.S. PATENT DOCUMENTS

| | | | |
|---|---|---|---|
| 2012/0003800 A1 | 1/2012 | Lee et al. | |
| 2014/0231899 A1* | 8/2014 | Lee | H10B 43/27 |
| | | | 257/324 |
| 2017/0263614 A1* | 9/2017 | Tokuhira | H10B 43/27 |
| 2018/0366487 A1* | 12/2018 | Okizumi | H10B 43/50 |
| 2019/0027493 A1* | 1/2019 | Kimura | H10B 41/41 |
| 2019/0296117 A1* | 9/2019 | Ishiduki | H10B 43/10 |
| 2019/0333928 A1* | 10/2019 | Nagashima | G11C 11/40 |
| 2020/0091181 A1 | 3/2020 | Nagashima | |
| 2020/0126974 A1* | 4/2020 | Liu | H01L 27/0688 |

* cited by examiner

SEMICONDUCTOR STORAGE DEVICE AND METHOD FOR MANUFACTURING SEMICONDUCTOR STORAGE DEVICE

CROSS-REFERENCE TO RELATED APPLICATION

This application is based upon and claims the benefit of priority from Japanese Patent Application No. 2021-043362, filed Mar. 17, 2021, the entire contents of which are incorporated herein by reference.

FIELD

Embodiments described herein relate generally to semiconductor storage devices and methods for manufacturing a semiconductor storage device.

BACKGROUND

A NAND flash memory is known in which memory cells are three-dimensionally stacked.

DETAILED DESCRIPTION

Figure 1:
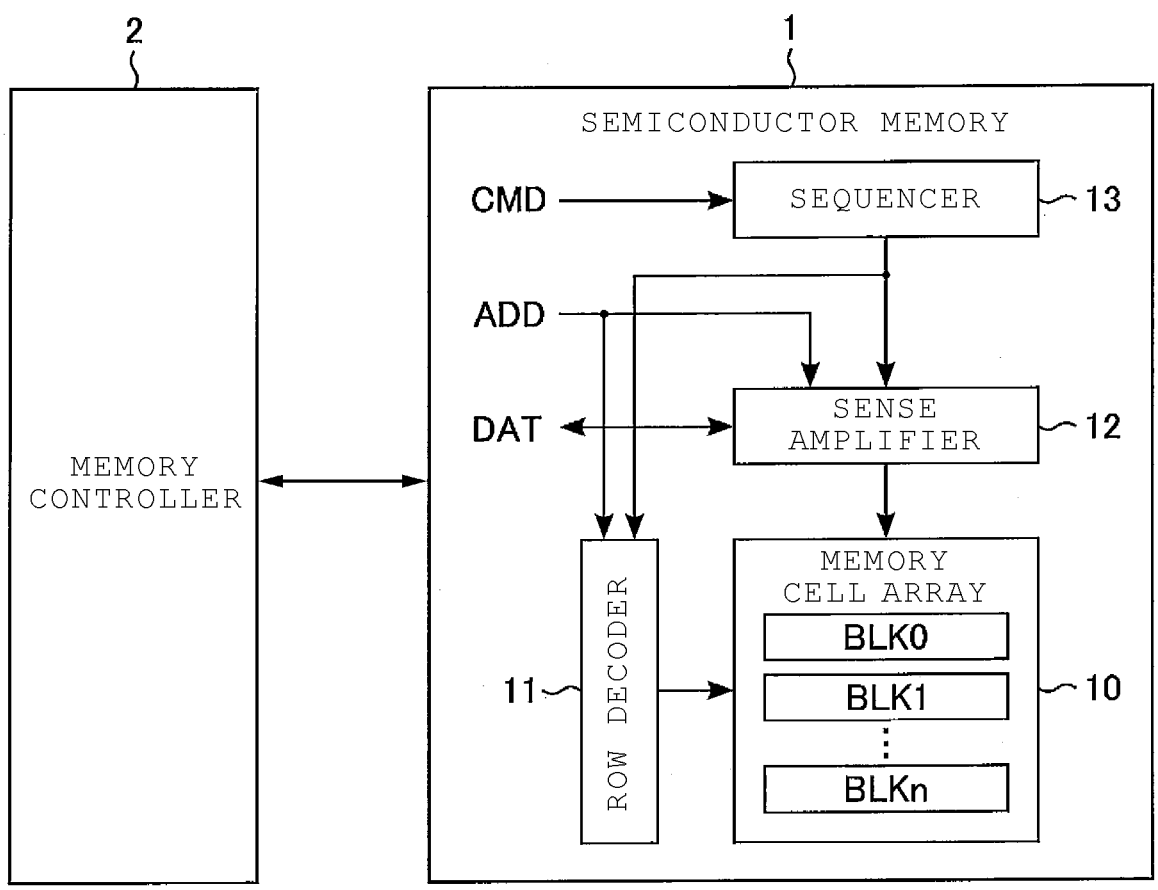
FIG. 1 is a block diagram illustrating a circuit configuration of a semiconductor storage device according to a first embodiment.

Embodiments provide a semiconductor storage device and a method for manufacturing a semiconductor storage device, capable of preventing operation failure due to disconnection.

In general, according to at least one embodiment, there is provided a semiconductor storage device including a first stacked body, a second stacked body, an intermediate insulating layer, and a plurality of columnar bodies. The first stacked body includes a plurality of conductive layers and a plurality of insulating layers, and is obtained by alternately stacking the conductive layers and insulating layers. The second stacked body is located above the first stacked body, includes a plurality of conductive layers and a plurality of insulating layers, and is obtained by alternately stacking the conductive layers and insulating layers. The intermediate insulating layer is located between the first stacked body and the second stacked body and has a thickness in the stacking direction larger than that of one insulating layer in the plurality of insulating layers of the first stacked body. The plurality of columnar bodies are provided over the first stacked body and the second stacked body, and each columnar body includes a core, a charge storage film provided between at least one of the plurality of conductive layers and the core, and a semiconductor body provided between the charge storage film and the core. Each of the plurality of columnar bodies includes a first columnar portion formed in the first stacked body, an intermediate columnar portion formed in the intermediate insulating layer, and a second columnar portion formed in the second stacked body. A width of the semiconductor body in the intermediate columnar portion in the direction intersecting the stacking direction is the shortest at an upper end of the intermediate columnar portion and the longest at a lower end of the intermediate columnar portion.

Hereinafter, the semiconductor storage device and the manufacturing method of the semiconductor storage device according to the embodiment will be described with reference to the drawings. The drawings are schematic or conceptual, and relationship between thicknesses and widths of portions, ratio of sizes between the portions, and the like are not always the same as actual ones. In the following description, configurations having the same or similar functions are denoted by the same reference numerals. In some cases, duplicate description of the configurations may be omitted. A number subsequent to a character that constitutes a reference numeral is used to distinguish between elements that are referred to by the reference numeral containing the same character and have a similar configuration. If it is not necessary to distinguish between the elements denoted by the reference numeral containing the same character, the elements are referred to by the reference numeral containing only the same character.

First, a +X direction, a −X direction, a +Y direction, a −Y direction, a +Z direction, and a −Z direction are defined. The +X direction, the −X direction, the +Y direction, and the −Y direction are directions substantially parallel to a surface of a substrate 20 (refer to FIG. 4) described later. The +X direction is a direction from one string unit SU0 described later toward another string unit SU1 (refer to FIG. 3). The −X direction is opposite to the +X direction. When the +X direction and the −X direction are not distinguished, the +X direction and the −X direction are simply referred to as an "X direction". The +Y direction and the −Y direction are directions that intersect (for example, substantially orthogonal to) the X direction. The +Y direction and the −Y direction are opposite to each other. When the +Y direction and the −Y direction are not distinguished, the +Y direction and the −Y direction are simply referred to as a "Y direction". The +Z direction and the −Z direction are directions that intersect (for example, substantially orthogonal to) the X direction and the Y direction. The +Z direction is a direction from a first stacked body 30A toward a second stacked body 30B described later (refer to FIG. 4). The −Z direction is opposite to the +Z direction. When the +Z direction and the −Z direction are not distinguished, the +Z direction and the −Z direction are simply referred to as a "Z direction" or a "stacking direction". In the specification, the "+Z direction" may be referred to as "upward" and the "−Z direction" may be referred to as "downward". However, such expressions are only for the convenience and do not specify the direction of gravity. In the embodiment, the +Z direction is an example of a "first direction". The +X direction is an example of a "second direction".

In the specification, the term "connection" is not limited to the case of being physically connected but also includes the case of being electrically connected. In the specification, the terms "facing", "overlapping", and "adjacent" are not limited to the case where two members are in contact with each other but also include the case where another member exists between the two members. In the specification, the term "extending in the A direction" denotes, for example, that the dimension in the A direction is larger than the smallest dimension among the dimensions in the X direction, the Y direction, and the Z direction. The "A direction" is a direction freely selected. In the specification, the term "width in the A direction" denotes the width in the A direction in a cross section substantially parallel to the X direction, which passes through a central axis C of a columnar body 40 or the vicinity of the central axis C in the Z direction (refer to FIG. 4). The term "central axis C of the columnar body 40" denotes a virtual axis line passing through the centers of the columnar body 40 in the X and Y directions in the Z direction.

First Embodiment

First, the overall configuration of a semiconductor storage device (semiconductor memory) according to an embodiment will be described. A semiconductor memory 1 according to the embodiment is a nonvolatile semiconductor storage device, for example, a NAND flash memory.

FIG. 1 is a block diagram illustrating a system configuration of the semiconductor memory 1. The semiconductor memory 1 includes, for example, a memory cell array 10, a row decoder 11, a sense amplifier 12, and a sequencer 13.

The memory cell array 10 includes a plurality of blocks BLK0 to BLKn (n is an integer of 1 or more). The block BLK is a set of nonvolatile memory cell transistors MT (refer to FIG. 2). The memory cell array 10 is provided with a plurality of bit lines and a plurality of word lines. Each of the memory cell transistors MT is associated with one bit line and one word line. The detailed configuration of the memory cell array 10 will be described later.

The row decoder 11 selects one block BLK based on address information ADD received from an external memory controller 2. The row decoder 11 controls a data write operation and a data read operation with respect to the memory cell array 10 by applying a desired voltage to each of the plurality of word lines.

The sense amplifier 12 applies a desired voltage to each bit line according to a write data DAT received from the memory controller 2. The sense amplifier 12 determines a data stored in the memory cell transistor MT based on the voltage of the bit line, and transmits a determined read data DAT to the memory controller 2.

The sequencer 13 controls the entire operations of the semiconductor memory 1 based on a command CMD received from the memory controller 2.

The semiconductor memory 1 and the memory controller 2 described above may be provided in one semiconductor device by combining the semiconductor memory 1 and the memory controller 2. Examples of the semiconductor device include a memory card such as an SD (registered trademark) card, a solid state drive (SSD), and the like.

Next, the electrical configuration of the memory cell array 10 will be described.

Figure 2:
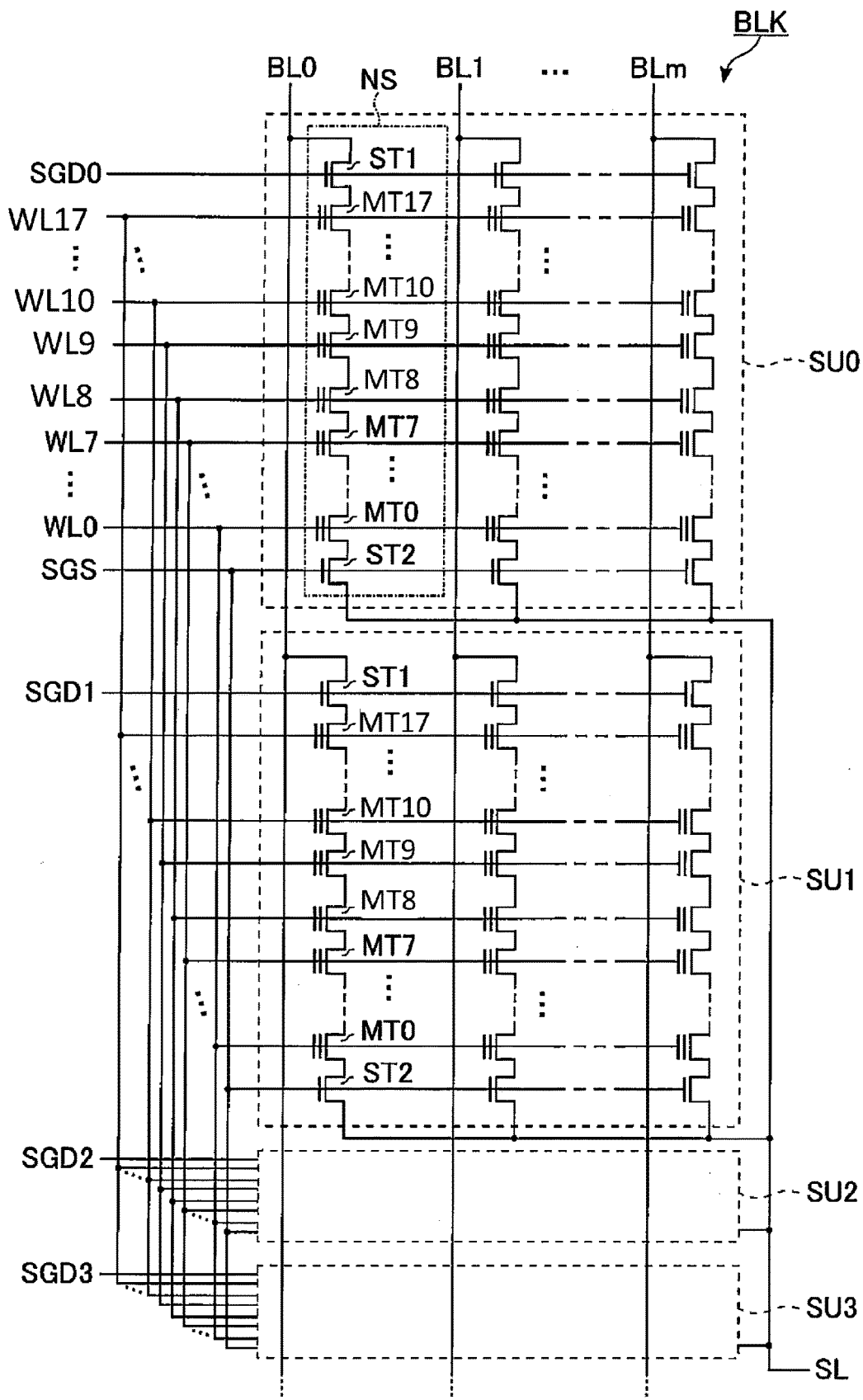
FIG. 2 is a circuit diagram of a memory cell array of the semiconductor storage device according to the first embodiment.

FIG. 2 is a diagram illustrating an equivalent circuit of the memory cell array 10, and one block BLK is extracted and illustrated. The block BLK includes a plurality of (for example, four) string units SU (SU0 to SU3).

Each string unit SU is an assembly of a plurality of NAND strings NS. One end of each of the NAND strings NS is connected to the bit line BL (any of BL0 to BLm (m is an integer of 1 or more)). The other end of each of the NAND strings NS is connected to a source line SL. Each of the NAND strings NS includes a plurality of (for example, 18) memory cell transistors MT (MT0 to MT17), a first select transistor ST1, and a second select transistor ST2.

The plurality of memory cell transistors MT (MT0 to MT17) are electrically connected in series with each other. The memory cell transistor MT includes a control gate and a charge storage film, and stores data in a nonvolatile manner. The memory cell transistor MT stores charges in the charge storage film according to a voltage applied to the control gate. The control gate of the memory cell transistor MT is connected to the corresponding word line WL (any of WL0 to WL17). The memory cell transistor MT is electrically connected to the row decoder 11 via the word line WL.

The first select transistor ST1 is connected between the plurality of memory cell transistors MT (MT0 to MT17) and the corresponding bit lines BL. A drain of the first select transistor ST1 is connected to the bit line BL. A source of the first select transistor ST1 is connected to the plurality of memory cell transistors MT. The control gate of the first select transistor ST1 is connected to a corresponding select gate line SGD (any of SGD0 to SGD3). The first select transistor ST1 is electrically connected to the row decoder 11 via the select gate line SGD. When a predetermined voltage is applied to the select gate line SGD, the first select transistor ST1 connects the NAND string NS and the bit line BL.

The second select transistor ST2 is connected between the plurality of memory cell transistors MT (MT0 to MT17) and the source line SL. The drain of the second select transistor ST2 is connected to the plurality of memory cell transistors MT. The source of the second select transistor ST2 is connected to the source line SL. The control gate of the second select transistor ST2 is connected to the select gate line SGS. The second select transistor ST2 is electrically connected to the row decoder 11 via the select gate line SGS. When a predetermined voltage is applied to the select gate line SGS, the second select transistor ST2 connects the NAND string NS and the source line SL.

Next, a physical configuration of the memory cell array 10 will be described.

Figure 3:
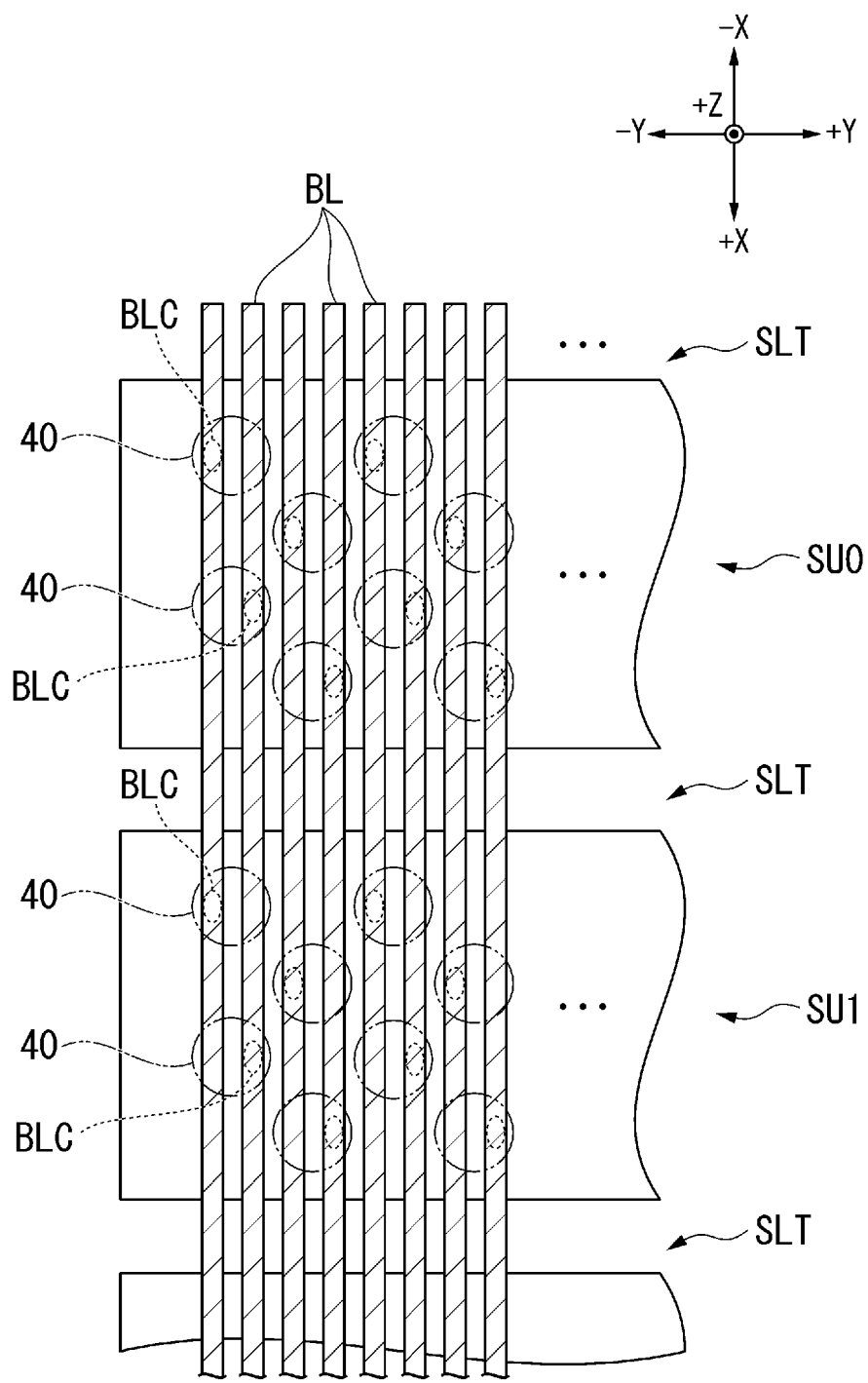
FIG. 3 is a plan view of the semiconductor storage device according to the first embodiment.

FIG. 3 is a plan view illustrating a partial region of the memory cell array 10. For example, the plurality of string units SU are arranged in the X direction and extended in the Y direction, respectively. The plurality of string units SU are separated from each other by slits SLT filled with an insulating material. Each string unit SU includes a plurality of columnar bodies 40 extending in the Z direction. Each of the columnar bodies 40 is connected to one bit line BL via a contact plug BLC described later. For example, the bit line BL extends in the X direction.

Figure 4:
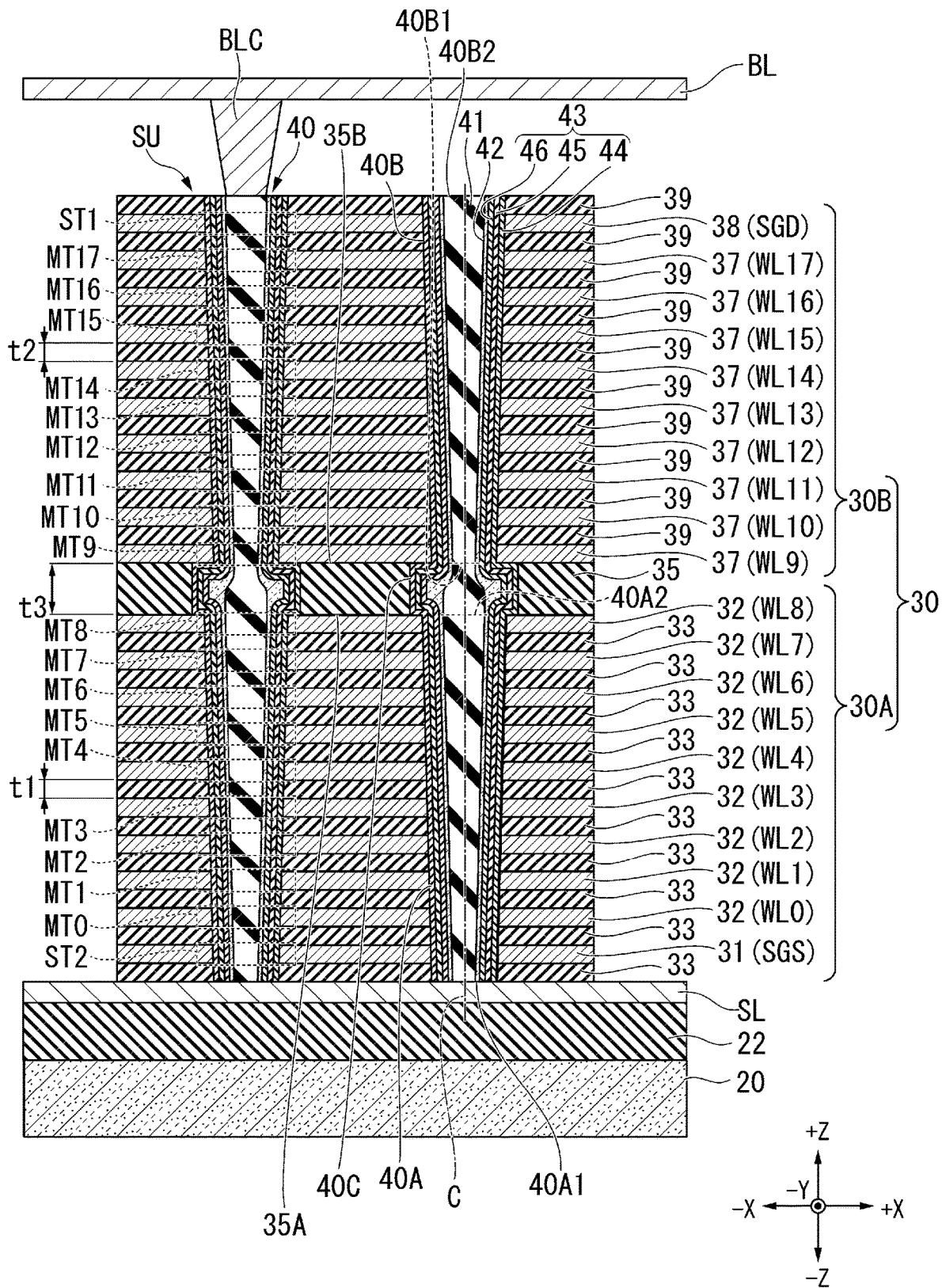
FIG. 4 is a cross-sectional view of the semiconductor storage device according to the first embodiment.

FIG. 4 is a cross-sectional view illustrating a partial region of the memory cell array 10. The memory cell array 10 includes, for example, a substrate 20, an insulating layer 22, a source line SL, a stacked body 30, a columnar body 40, a contact plug BLC, and a bit line BL.

The substrate 20 has surfaces along the X and Y directions. The substrate 20 is, for example, a silicon substrate. The insulating layer 22 is provided on the substrate 20. A drive circuit including a complementary MOS (CMOS) and the like is provided inside the insulating layer 22. The source line SL which is a conductor is provided on the insulating layer 22. The source line SL is formed in a plate shape substantially parallel to the X direction and the Y direction.

The stacked body 30 is provided on the source line SL. The stacked body 30 includes a first stacked body 30A, an intermediate insulating layer 35, and a second stacked body 30B.

The first stacked body 30A includes one conductive layer 31, a plurality of conductive layers 32, and a plurality of insulating layers 33. In the first stacked body 30A, the plurality of conductive layers 31 and 32 and the plurality of insulating layers 33 are stacked in the Z direction. The conductive layer 31 functions as a selective gate line SGS. The plurality of conductive layers 32 are located above the conductive layer 31 and function as word lines WL0 to WL8, respectively. The insulating layers 33 are provided between the conductive layer 31 and the conductive layer 32, and between the plurality of conductive layers 32, respectively. Each of the conductive layers 31 and 32 and the insulating layer 33 is formed in a plate shape along the X direction and the Y direction.

The second stacked body 30B is located above the first stacked body 30A. The second stacked body 30B includes a plurality of conductive layers 37, one conductive layer 38, and a plurality of insulating layers 39. In the second stacked body 30B, the plurality of conductive layers 37 and 38 and the plurality of insulating layers 39 are stacked in the Z direction. The plurality of conductive layers 37 function as respective word lines WL9 to WL17. The conductive layer 38 is located above the plurality of conductive layers 37 and functions as a select gate line SGD. The insulating layer 39 is provided between the plurality of conductive layers 37 and between the conductive layer 37 and the conductive layer 38, respectively. Each of the conductive layers 37 and 38 and the insulating layer 39 is formed in a plate shape along the X direction and the Y direction.

The intermediate insulating layer 35 is located between the first stacked body 30A and the second stacked body 30B in the Z direction. A thickness (for example, maximum thickness) t3 of the intermediate insulating layer 35 in the Z direction is larger than a thickness t1 of any one of the insulating layers 33 contained in the first stacked body 30A in the Z direction, and the thickness t3 is larger than a thickness t2 of any one of the insulating layers 39 contained in the second stacked body 30B in the Z direction. The "thickness t3 of the intermediate insulating layer 35" is a distance between a lower surface 35A of the intermediate insulating layer 35 in contact with the uppermost conductive layer 32 in the first stacked body 30A and an upper surface 35B of the intermediate insulating layer 35 in contact with the lowermost conductive layer 37 in the second stacked body 30B.

The thickness t3 of the intermediate insulating layer 35 may be 30 nm or less.

The columnar body 40 functions as, for example, one NAND string NS. The columnar body 40 is provided in the stacked body 30 along the Z direction and reaches the inside of the first stacked body 30A by starting from at least the inside of the second stacked body 30B and penetrating the intermediate insulating layer 35. The lower end of the columnar body 40 is connected to the source line SL. The upper end of the columnar body 40 is connected to the bit line BL via the contact plug BLC. The contact plug BLC denotes a connecting member having a columnar shape, an inverted truncated cone shape, or the like which is made of a conductive material. In at least one embodiment, the columnar body 40 includes a first columnar portion 40A, a second columnar portion 40B, and an intermediate columnar portion 40C.

The first columnar portion 40A is formed in the first stacked body 30A and extends in the first stacked body 30A in the Z direction. The first columnar portion 40A has a lower end 40A1 and an upper end 40A2. The lower end 40A1 is in contact with the source line SL. The upper end 40A2 is in contact with the second columnar portion 40B. For example, as the first columnar portion 40A advances from the upper end 40A2 toward the lower end 40A1, the widths of the first columnar portion 40A in the X direction and the Y direction are gradually decreased.

The second columnar portion 40B is formed in the second stacked body 30B and extends in the second stacked body 30B in the Z direction. The second columnar portion 40B has a lower end 40B1 and an upper end 40B2. The lower end 40B1 is in contact with the intermediate columnar portion 40C. The upper end 40B2 is in contact with the contact plug BLC. For example, as the second columnar portion 40B advances from the upper end 40B2 toward the lower end 40B1, the widths of the second columnar portion 40B in the X direction and the Y direction are gradually decreased.

The intermediate columnar portion 40C is formed in the intermediate insulating layer 35 and extends in the intermediate insulating layer 35 in the Z direction. The intermediate columnar portion 40C has a lower end 40C1 and an upper end 40C2. The lower end 40C1 is in contact with the first columnar portion 40A. The upper end 40C2 is in contact with the second columnar portion 40B. For example, the upper end 40C2 and the lower end 40C1 of the intermediate columnar portion 40C have the same widths in the X direction and the Y direction. The thickness of the intermediate columnar portion 40C in the Z direction (stacking direction) is the same as the thickness t3 of the intermediate insulating layer 35.

Each of the columnar bodies 40 includes a core 41, a semiconductor body 42, and a memory film 43 in this order from the inner side. The columnar body 40 is formed in a memory hole which is a hole penetrating the stacked body 30 in the Z direction. The memory film 43 is provided on an inner wall of the memory hole.

The core 41 extends in the Z direction and is columnar. The core 41 contains, for example, a silicon oxide. The core 41 exists inside the semiconductor body 42.

The semiconductor body 42 extends in the Z direction. The semiconductor body 42 covers an outside surface of the core 41. The semiconductor body 42 is located between the inside surface of the memory film 43 and the outside surface of the core 41. The semiconductor body 42 contains, for example, silicon. Silicon is, for example, polysilicon obtained by crystallizing amorphous silicon. The semiconductor body 42 is a channel of each of a first select transistor ST1, a memory cell transistor MT, and a second select transistor ST2. The channel is a carrier flow path between the source side and the drain side.

The memory film 43 extends in the Z direction. The memory film 43 covers an outside surface of the semiconductor body 42. The memory film 43 is located between the inner surface of the memory hole and the outside surface of the semiconductor body 42. The memory film 43 includes a block insulating film 44, a charge storage film 45, and a tunnel insulating film 46. The memory film 43 is located near the semiconductor body 42 in the order of the block insulating film 44, the charge storage film 45, and the tunnel insulating film 46 from the inner wall of the memory hole.

The block insulating film 44 is located between the charge storage film 45 and each of the conductive layers 31, 32, 37, 38 and the insulating layers 33 and 39 of the first stacked body 30A and the second stacked body 30B. The block insulating film 44 is a stacked structure film in which a silicon oxide film, a metal oxide film, and a plurality of insulating films are stacked. An example of the metal oxide is an aluminum oxide.

The charge storage film 45 is located between the block insulating film 44 and the tunnel insulating film 46. The charge storage film 45 contains, for example, a silicon nitride. A portion where the charge storage film 45 intersects each of the plurality of conductive layers 31, 32, 37, and 38 functions as a transistor. The memory cell transistor MT stores data according to the presence of a charge in the portions (charge storage portions) where the charge storage film 45 intersects the plurality of conductive layers 31, 32, 37, and 38 or the amount of stored charges. The charge storage portion is located between each of the conductive layers 31, 32, 37, and 38 and the semiconductor body 42 and is surrounded by an insulating material.

The tunnel insulating film 46 is located between the charge storage film 45 and the semiconductor body 42. The tunnel insulating film 46 contains, for example, a silicon oxide, or a silicon oxide and a silicon nitride. The tunnel insulating film 46 is a potential barrier between the semiconductor body 42 and the charge storage film 45.

In the semiconductor memory 1 having such a configuration, the intersection of the columnar body 40 and each of the conductive layers 31, 32, 37, and 38 of the first stacked body 30A and the second stacked body 30B function as transistors. For example, the intersection of the columnar body 40 and the conductive layer 38 functions as the first select transistor ST1. The intersection between the columnar body 40 and the conductive layer 31 functions as the second select transistor ST2. The intersections of the columnar body 40 and the plurality of conductive layers 32 and 38 function as the respective memory cell transistors MT (MT0 to MT17).

Figure 5:
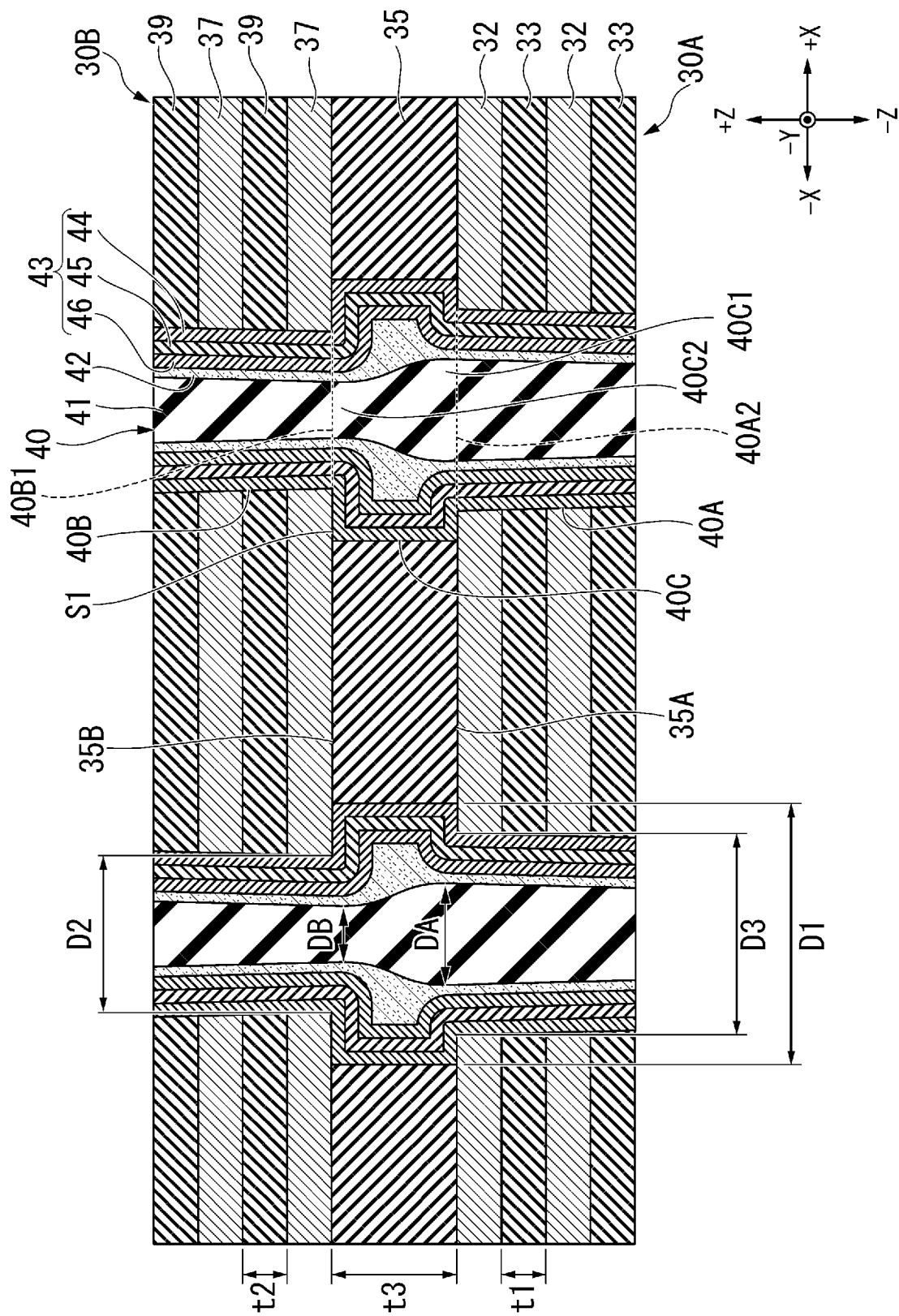
FIG. 5 is a cross-sectional view illustrating a region near an intermediate columnar portion of the memory cell array of the first embodiment.

FIG. 5 is an enlarged cross-sectional view illustrating a region near the intermediate columnar portion 40C of the memory cell array 10.

In the memory cell array 10 of the embodiment, the width of the semiconductor body 42 in the intermediate columnar portion 40C in the direction intersecting the stacking direction is the shortest at the upper end 40C2 (DB in FIG. 5) of the intermediate columnar portion 40C and is the longest at the lower end 40C1 (DA in FIG. 5) of the intermediate columnar portion 40C. The width of the semiconductor bodies 42 in the direction intersecting the stacking direction is the distance between the semiconductor bodies 42 sandwiching the core 41 in the cross section of the memory cell array 10. When the cross-sectional shape of the semiconductor body 42 in the direction intersecting the stacking direction is a circle, the width of the semiconductor body 42 in the direction intersecting the stacking direction is the diameter of the circle. When the cross-sectional shape is an ellipse, the width is the length of the major axis of the ellipse. When the cross-sectional shape is a polygon, the largest length of the polygon is the length of the diagonal line.

The width of the semiconductor body 42 in the intermediate columnar portion 40C in the direction intersecting the stacking direction may be increased as the semiconductor body 42 moves from the upper end 40C2 of the intermediate columnar portion 40C to the lower end 40C1. Here, the width of the semiconductor bodies 42 in the direction intersecting the stacking direction may be continuously increased or may be increased stepwise.

The thickness t3 (thickness of the intermediate columnar portion 40C in the stacking direction) in the stacking direction (Z direction) of the intermediate insulating layer 35 is twice or less the average film thickness of the memory film 43 in the intermediate columnar portion 40C, that is, the average film thickness between the outside surface of the semiconductor body 42 and the outside surface of the intermediate columnar portion 40C. For example, when the thickness t3 of the intermediate insulating layer 35 is 30 nm or less, the average film thickness of the memory film 43 is 15 nm or less. The width of the intermediate columnar portion 40C in the direction intersecting the stacking direction of the memory film 43 (particularly, the charge storage film 45) may be maximum between the upper end 40C2 and the lower end 40C1 of the intermediate columnar portion (that is, portions other than the upper end 40C2 and the lower end 40C1).

The intermediate columnar portion 40C may be expanded more than the first columnar portion 40A and the second columnar portion 40B in the X direction and the Y direction. For example, the outer peripheral length of the lower end 40C1 of the intermediate columnar portion 40C may be larger than the outer peripheral length of the upper end 40A2 of the first columnar portion 40A, and the outer peripheral length of the upper end 40C2 of the intermediate columnar portion 40C may be larger than the outer peripheral length of the lower end of the second columnar portion 40B. The outer peripheral length of the lower end 40B1 of the second columnar portion 40B may be smaller than the outer peripheral length of the upper end 40A2 of the first columnar portion 40A.

Next, an example of the method for manufacturing the memory cell array 10 will be described.

Figure 6:
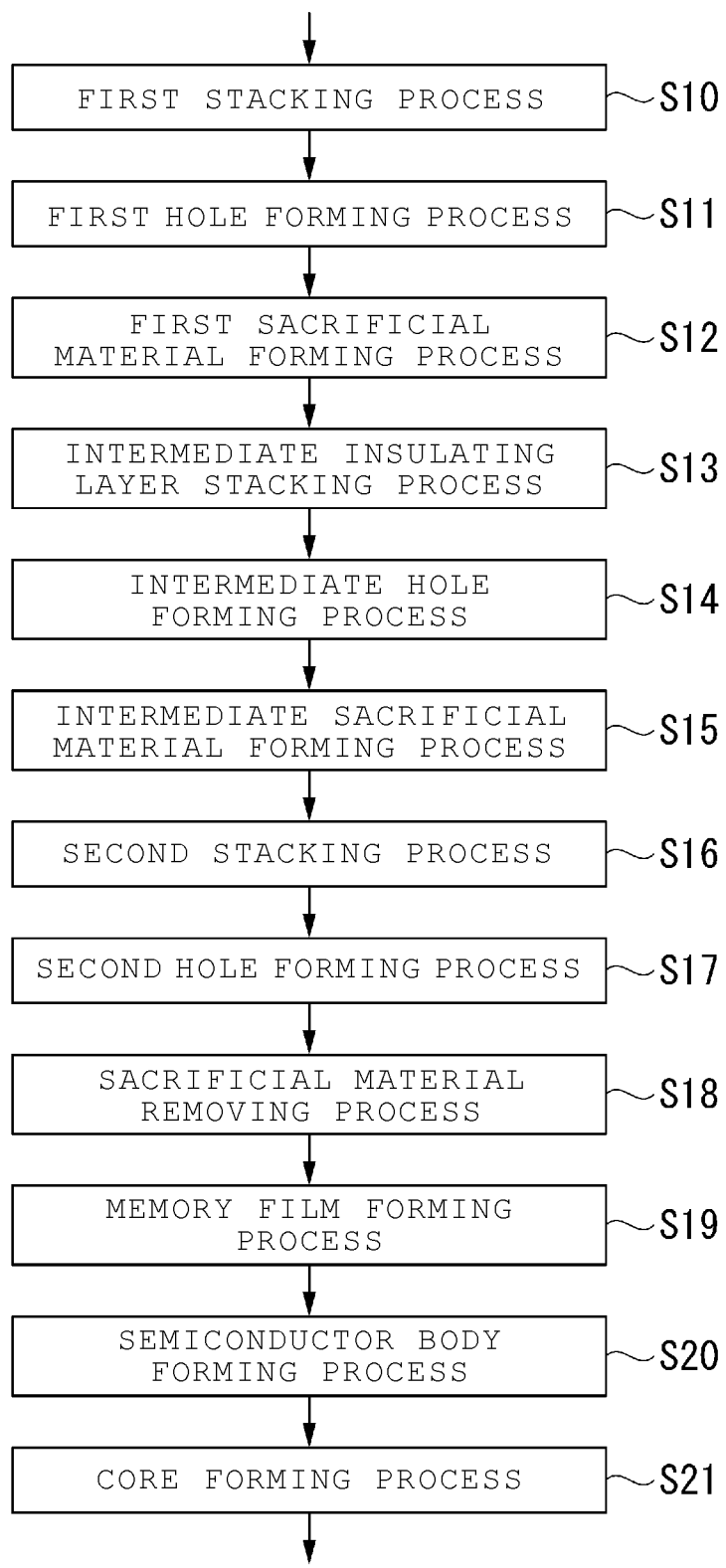
FIG. 6 is a process chart illustrating a method for manufacturing the memory cell array of the first embodiment.

FIG. 6 is a process diagram illustrating the example of the method for manufacturing the memory cell array 10. FIGS. 7 to 19 are cross-sectional views illustrating respective manufacturing processes for the memory cell array 10.

Figure 7:
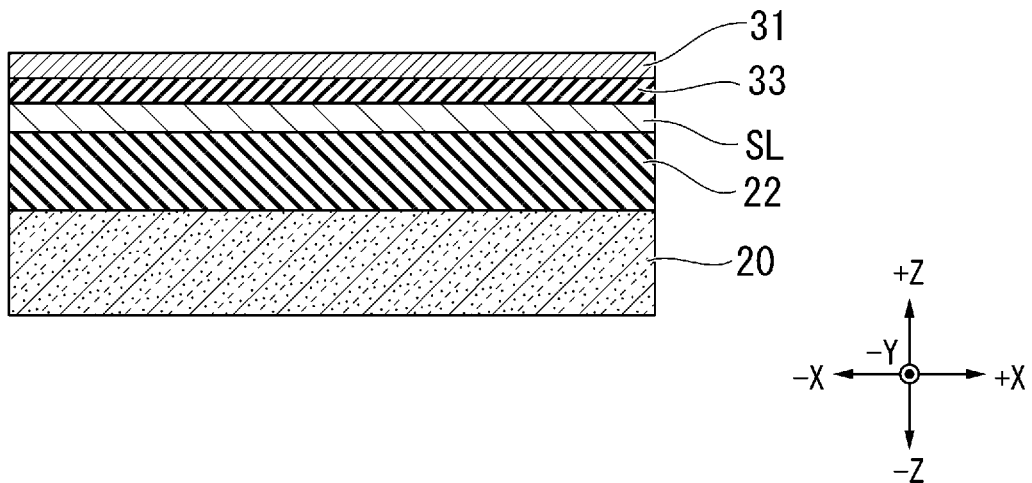
FIG. 7 is a cross-sectional view illustrating an example of a manufacturing process for the memory cell array of the first embodiment.

FIG. 7 is a cross-sectional view corresponding to a pre-process of the first stacking process illustrated in FIG. 6. In the pre-process, the insulating layer 22 and the source line SL are formed on the substrate 20. The drive circuit including CMOS and the like is formed on the insulating layer 22. One insulating layer 33 and one conductive layer 31 are stacked on the source line SL.

Figure 8:
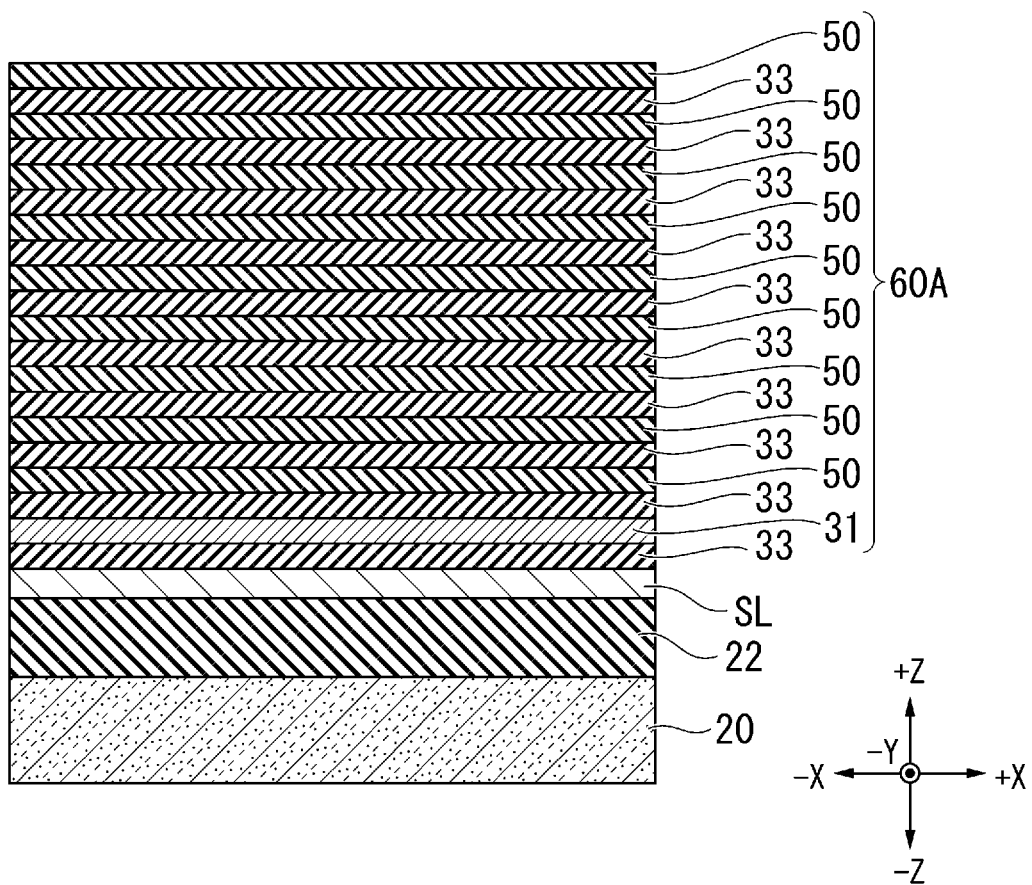
FIG. 8 is a cross-sectional view illustrating an example of a manufacturing process for the memory cell array of the first embodiment.

FIG. 8 is a cross-sectional view corresponding to a first stacking process (S10) illustrated in FIG. 6. In the first stacking process, the insulating layer 33 and a sacrifice layer are alternately stacked on the conductive layer 31.

Accordingly, a first stacked precursor 60A is produced. The sacrifice layer 50 is a nitride film such as silicon nitride (SiN).

Figure 9:
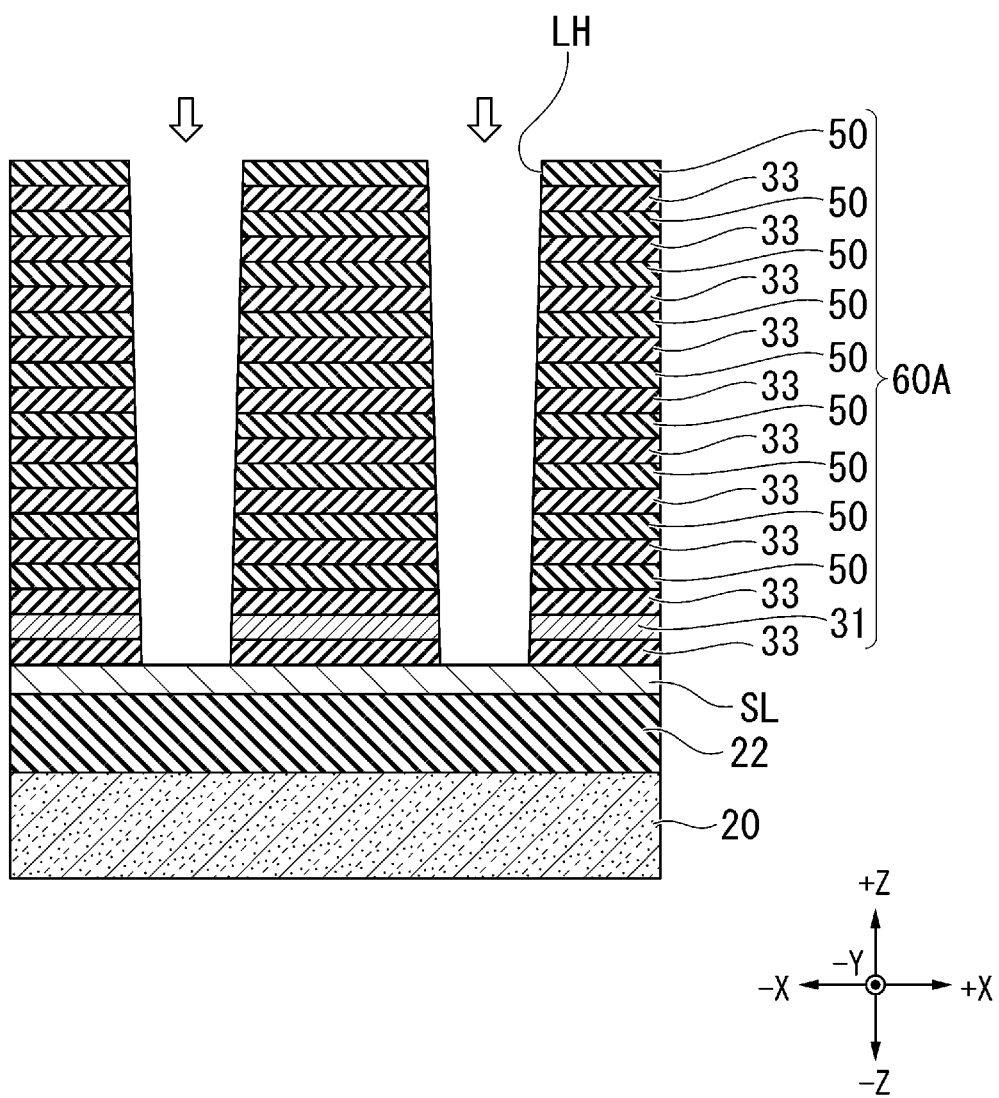
FIG. 9 is a cross-sectional view illustrating an example of a manufacturing process for the memory cell array of the first embodiment.

FIG. 9 is a cross-sectional view corresponding to a first hole forming process (S11) illustrated in FIG. 6. In the first hole forming process, a first hole LH is formed in the first stacked precursor 60A stacked in the first stacking process (S10). The first hole LH is processed by photolithography and anisotropic etching. For the anisotropic etching, for example, reactive ion etching (RIE) may be used.

Figure 10:
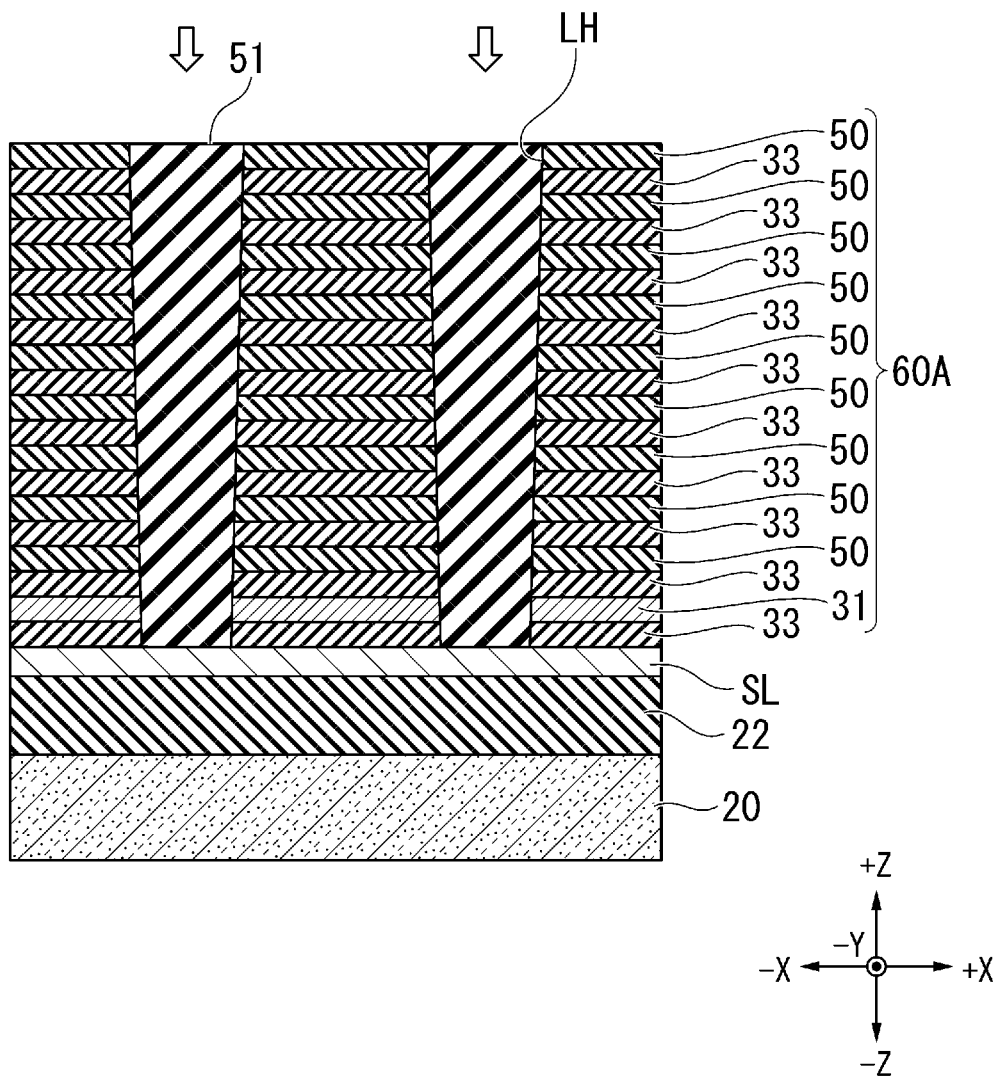
FIG. 10 is a cross-sectional view illustrating an example of a manufacturing process for the memory cell array of the first embodiment.

FIG. 10 is a cross-sectional view corresponding to a first sacrificial material forming process (S12) illustrated in FIG. 6. In the first sacrificial material forming process, a first sacrificial material 51 is formed inside the hole LH formed in the first hole forming process (S11). The first sacrificial material 51 is, for example, amorphous silicon (aSi).

Figure 11:
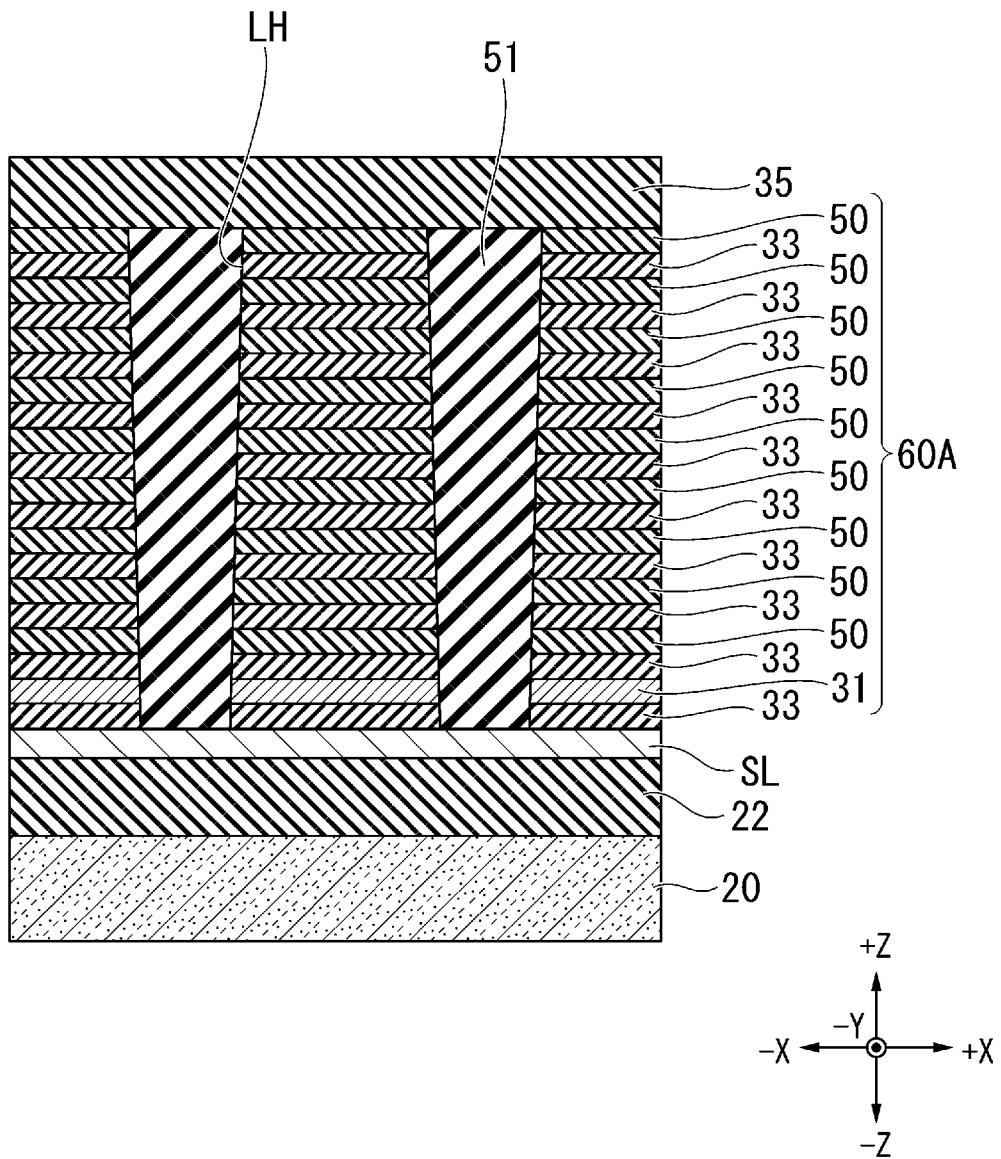
FIG. 11 is a cross-sectional view illustrating an example of a manufacturing process for the memory cell array of the first embodiment.

FIG. 11 is a cross-sectional view corresponding to an intermediate insulating layer stacking process (S13) illustrated in FIG. 6. In the intermediate insulating layer stacking process, the intermediate insulating layer 35 is stacked on the first sacrificial material 51 formed in the first sacrificial material forming process (S12) and the uppermost sacrifice layer 50 of the first stacked precursor 60A.

Figure 12:
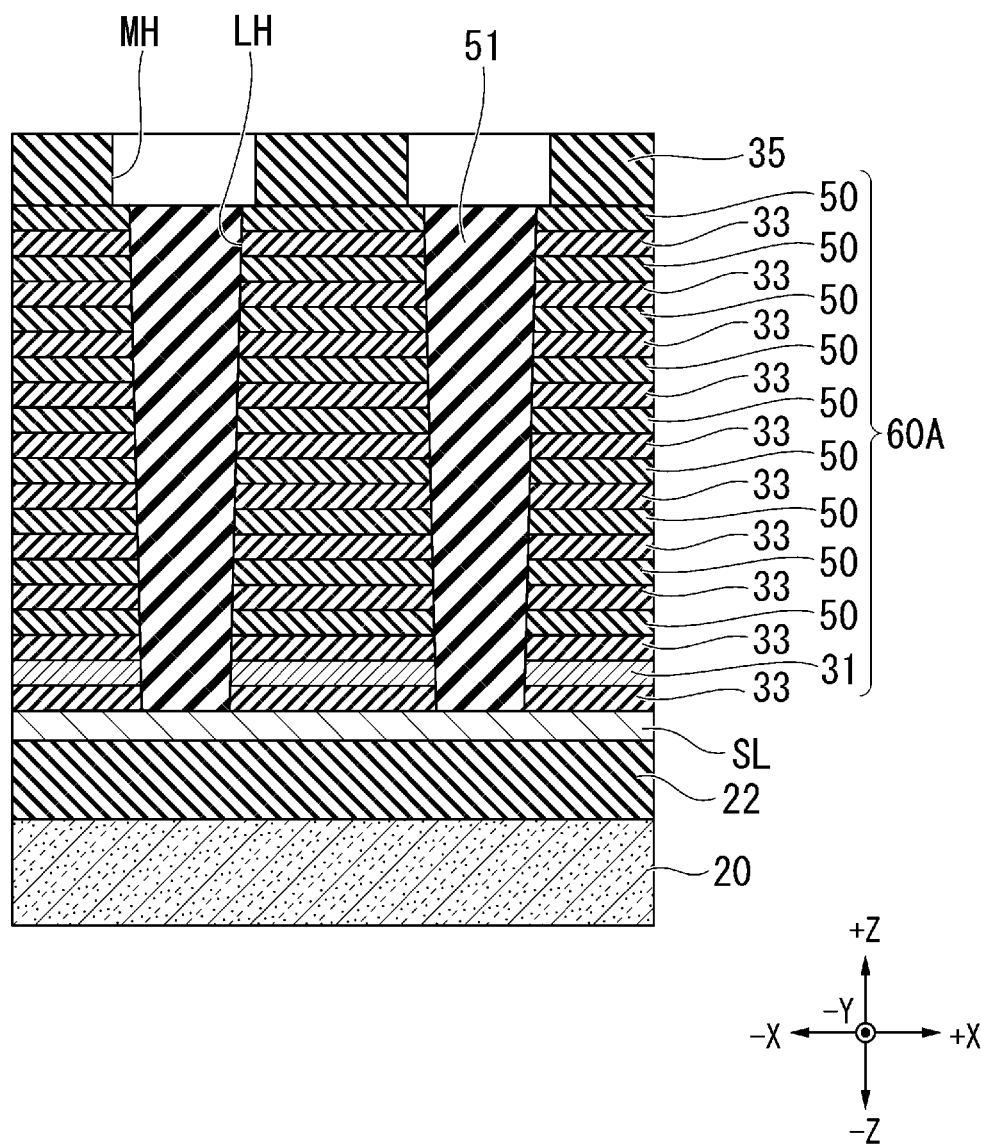
FIG. 12 is a cross-sectional view illustrating an example of a manufacturing process for the memory cell array of the first embodiment.

FIG. 12 is a cross-sectional view corresponding to an intermediate hole forming process (S14) illustrated in FIG. 6. In the intermediate hole forming process, an intermediate hole MH is formed in the intermediate insulating layer 35 stacked in the intermediate insulating layer stacking process (S13). The intermediate hole MH is processed by photolithography and anisotropic etching. For the anisotropic etching, for example, RIE may be used. The intermediate hole MH may be extended more than the first hole LH in the X and Y directions.

Figure 13:
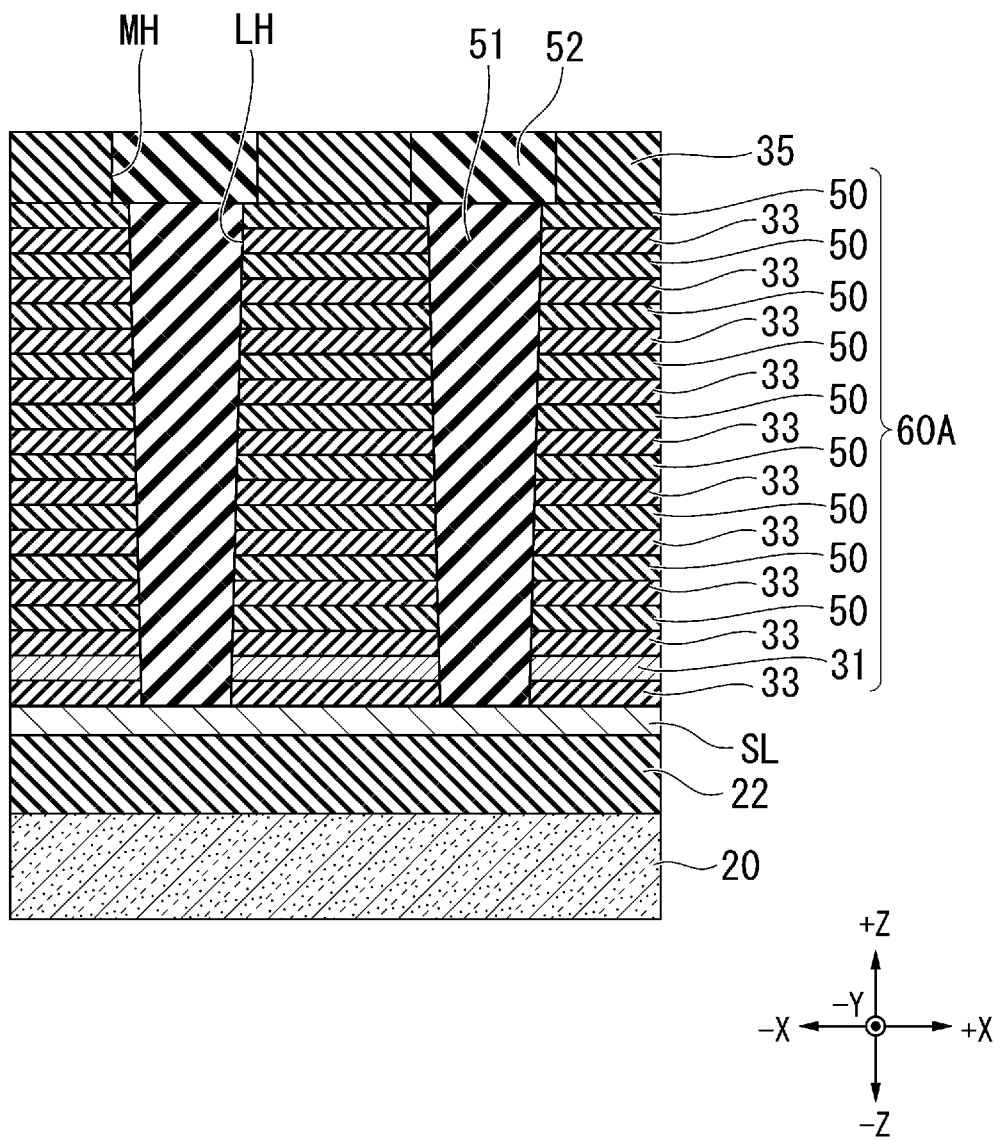
FIG. 13 is a cross-sectional view illustrating an example of a manufacturing process for the memory cell array of the first embodiment.

FIG. 13 is a cross-sectional view corresponding to an intermediate sacrificial material forming process (S15) illustrated in FIG. 6. In the intermediate sacrificial material forming process, an intermediate sacrificial material 52 is formed inside the intermediate hole MH formed in the intermediate hole forming process (S14). The intermediate sacrificial material 52 is, for example, amorphous silicon (aSi).

Figure 14:
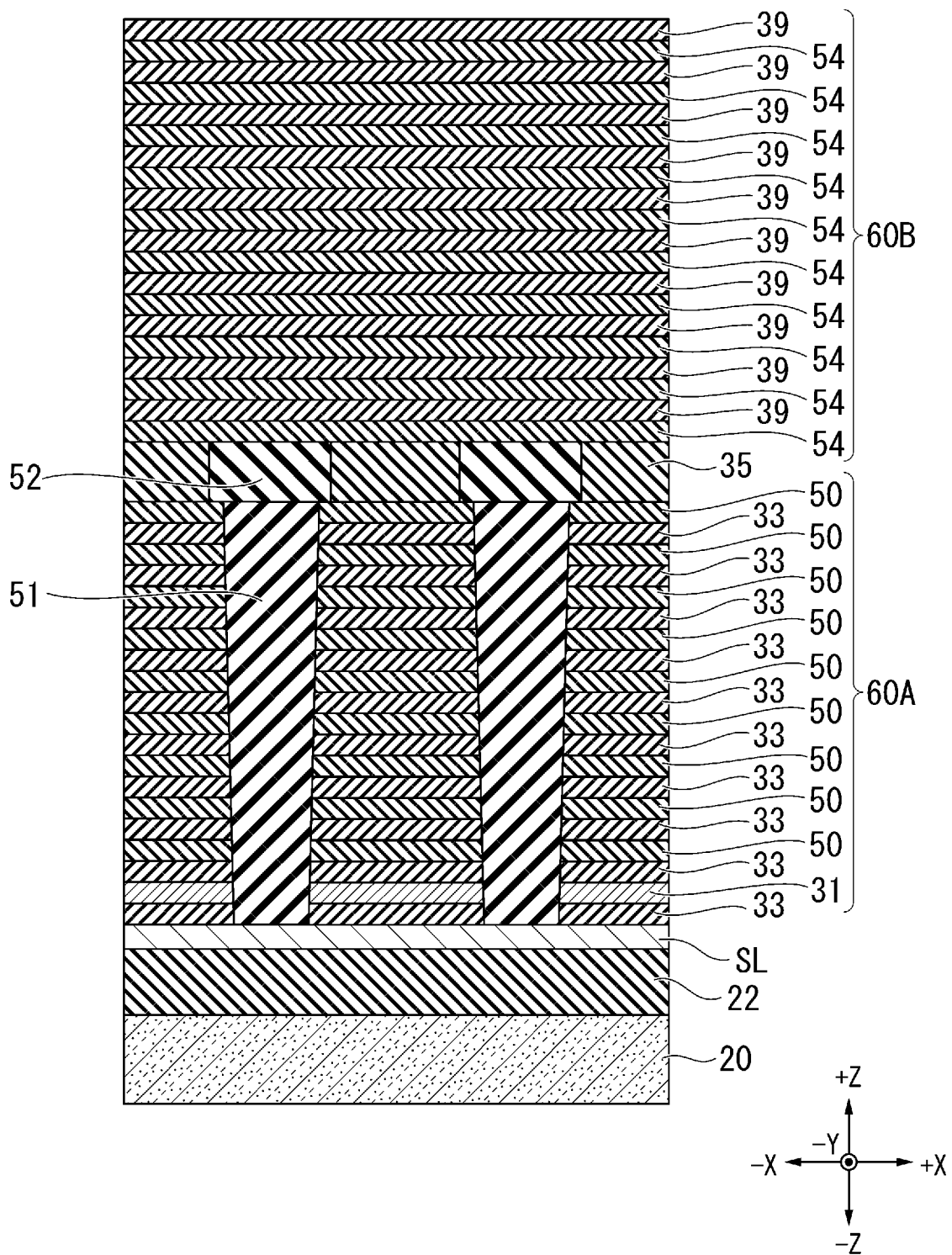
FIG. 14 is a cross-sectional view illustrating an example of a manufacturing process for the memory cell array of the first embodiment.

FIG. 14 is a cross-sectional view corresponding to a second stacking process (S16) illustrated in FIG. 6. In the second stacking process, the insulating layer 33 and a sacrifice layer 54 are alternately stacked on the intermediate sacrificial material 52 and the intermediate insulating layer 35 formed in the intermediate sacrificial material forming process (S15). Accordingly, a second stacked precursor 60B is produced. The sacrifice layer 54 is a nitride film such as silicon nitride (SiN).

Figure 15:
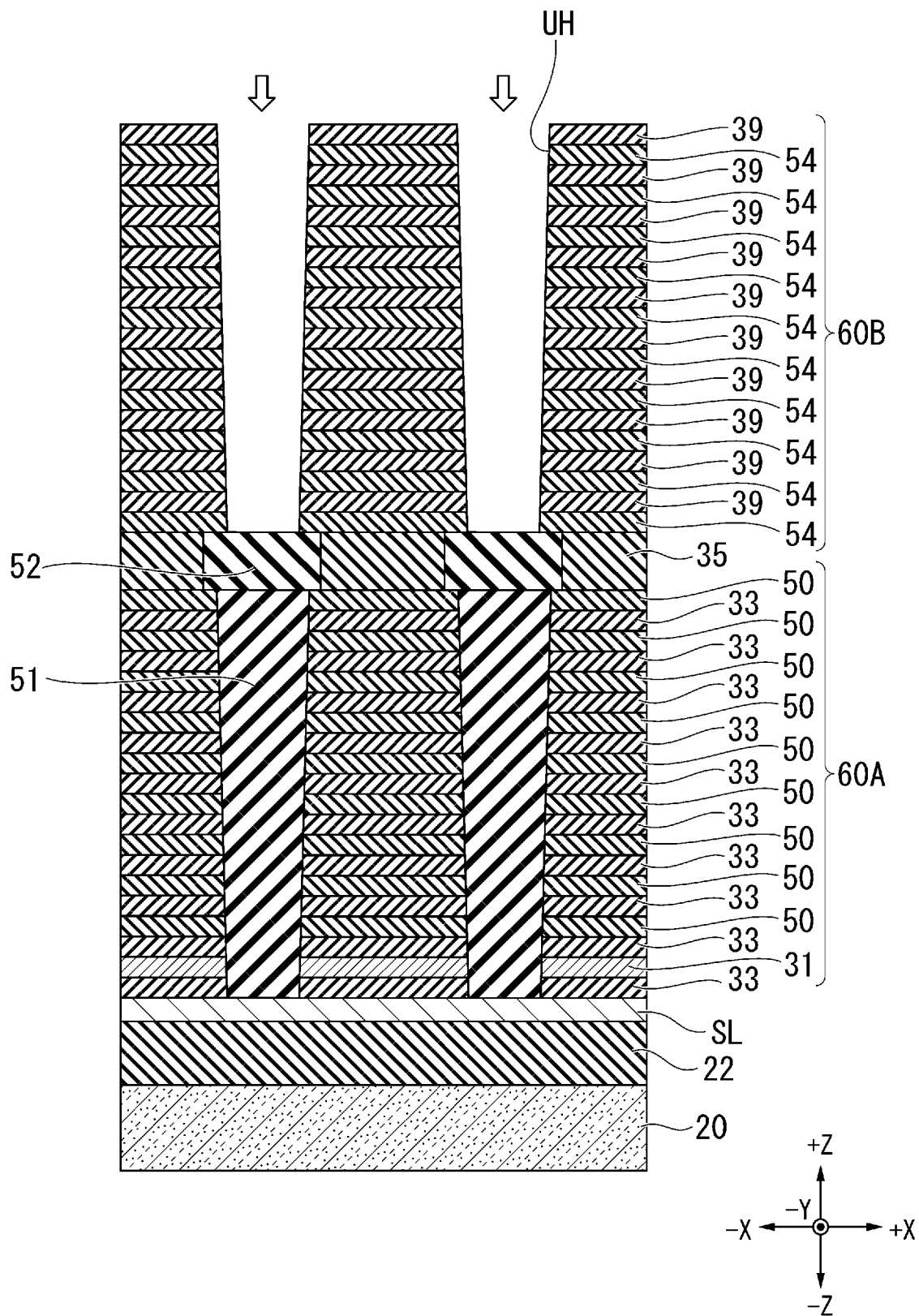
FIG. 15 is a cross-sectional view illustrating an example of a manufacturing process for the memory cell array of the first embodiment.

FIG. 15 is a cross-sectional view corresponding to a second hole forming process (S17) illustrated in FIG. 6. In the second hole forming process, a second hole UH is formed in the second stacked precursor 60B stacked in the second stacking process (S16). The second hole UH is processed by photolithography and anisotropic etching. For the anisotropic etching, for example, RIE may be used. The second hole UH is formed to be connected to the intermediate sacrificial material 52 of the intermediate insulating layer 35. The lower end portion of the second hole UH has a shape smaller than that of the intermediate sacrificial material 52.

Figure 16:
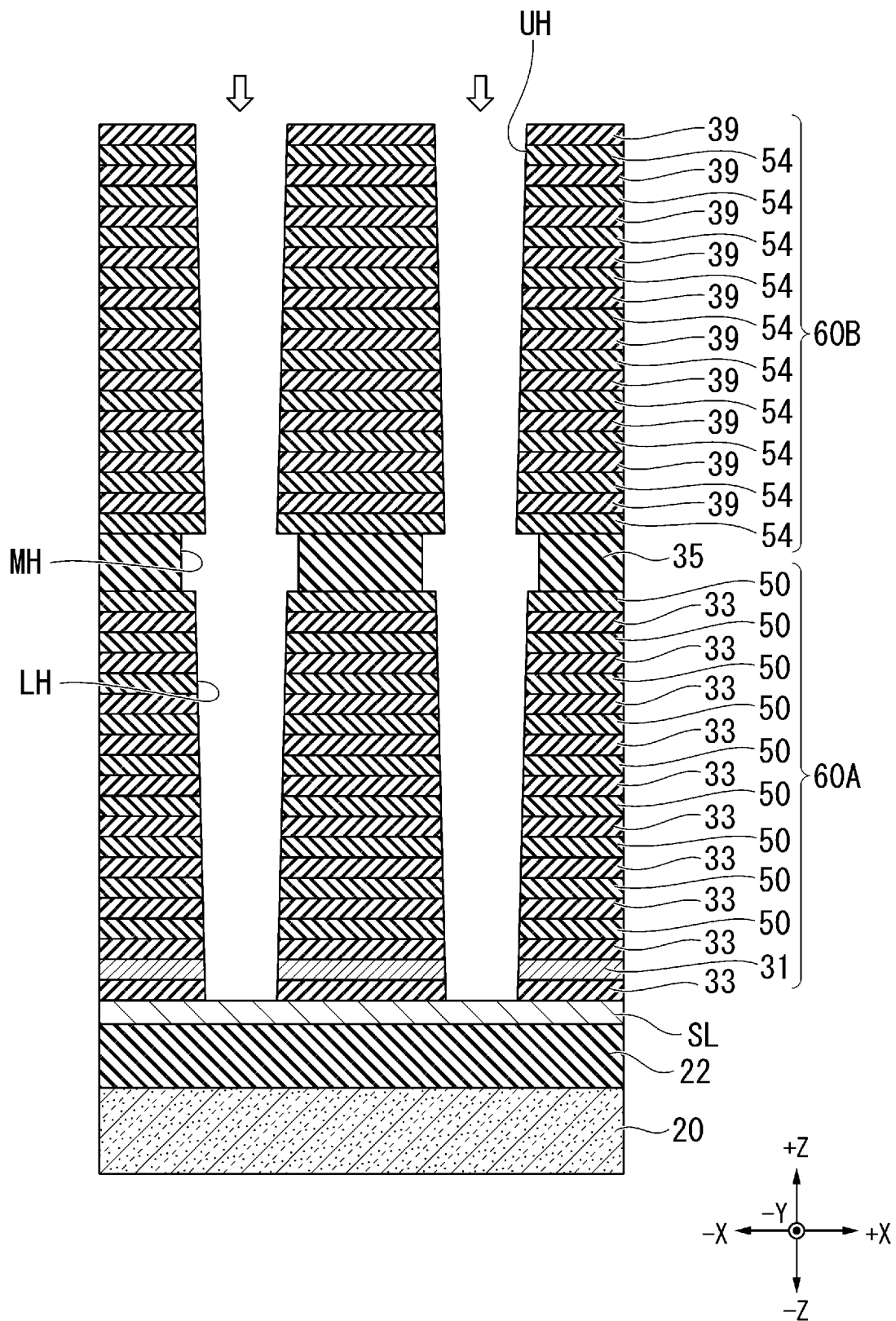
FIG. 16 is a cross-sectional view illustrating an example of a manufacturing process for the memory cell array of the first embodiment.

FIG. 16 is a cross-sectional view corresponding to a sacrificial material removing process (S18) illustrated in FIG. 6. In the sacrificial material removing process, the first sacrificial material 51 and the intermediate sacrificial material 52 are removed by wet etching. Accordingly, inner wall surfaces of the first hole LH and the intermediate hole MH are exposed.

Figure 17:
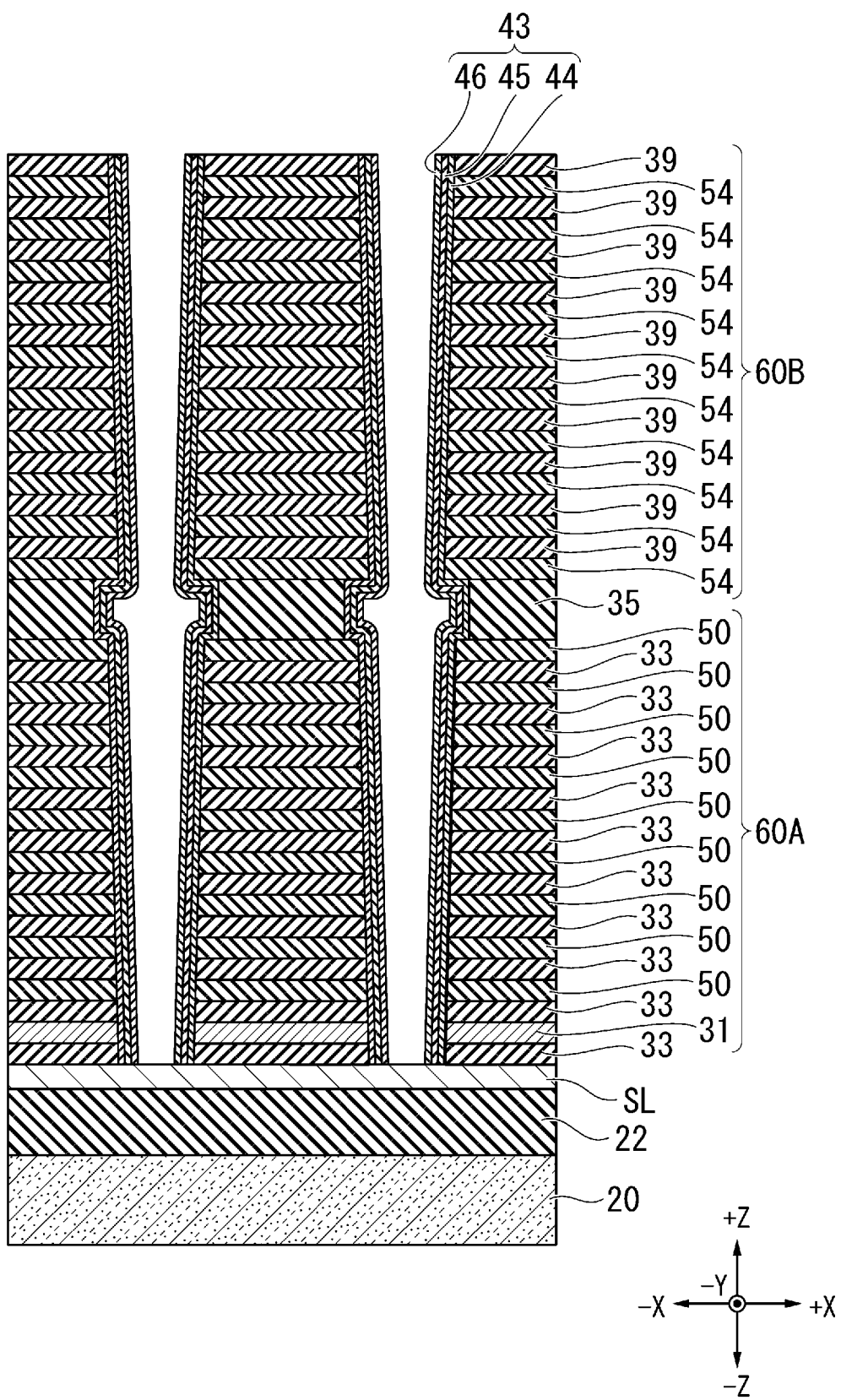
FIG. 17 is a cross-sectional view illustrating an example of a manufacturing process for the memory cell array of the first embodiment.

FIG. 17 is a cross-sectional view corresponding to a memory film forming process (S19) illustrated in FIG. 6. In the memory film forming process, the memory film 43 is formed by stacking the block insulating film 44, the charge storage film 45, and the tunnel insulating film 46 in this order on the inner wall surfaces of the first hole LH and the intermediate hole MH of which the inner wall surfaces are exposed in the sacrificial material removing process (S18) and the inner wall surface of the second hole UH.

Figure 18:
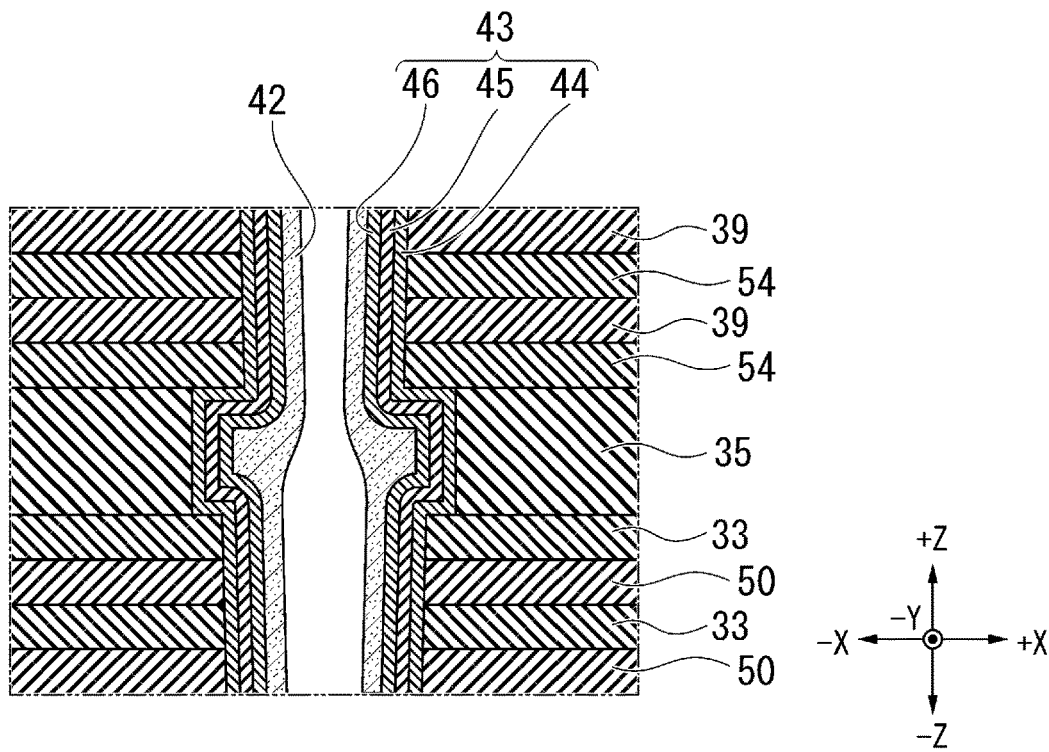
FIG. 18 is a cross-sectional view illustrating an example of a manufacturing process for the memory cell array of the first embodiment.
Figure 19:
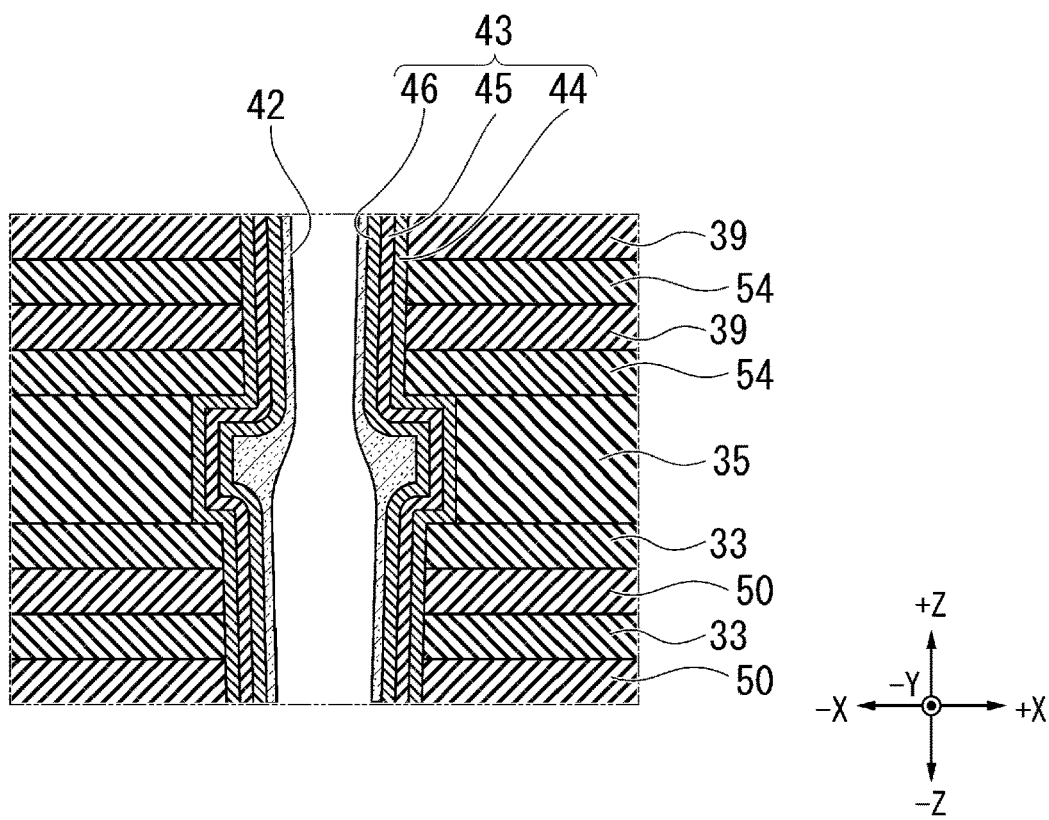
FIG. 19 is a cross-sectional view illustrating an example of a manufacturing process for the memory cell array of the first embodiment.

FIGS. 18 and 19 are cross-sectional views corresponding to a semiconductor body forming process (S20) illustrated in FIG. 6. In the semiconductor body forming process, first, as illustrated in FIG. 18, the semiconductor body 42 is formed inside the tunnel insulating film 46 of the memory film 43 formed in the memory film forming process (S19). Next, as illustrated in FIG. 19, wet slimming is performed to adjust the film thickness. By performing wet slimming, unevenness of the surface of the semiconductor body 42 becomes small, and the width of the semiconductor body 42 in the direction intersecting the stacking direction tends to be the shortest at the upper end and the longest at the lower end.

Figure 20:
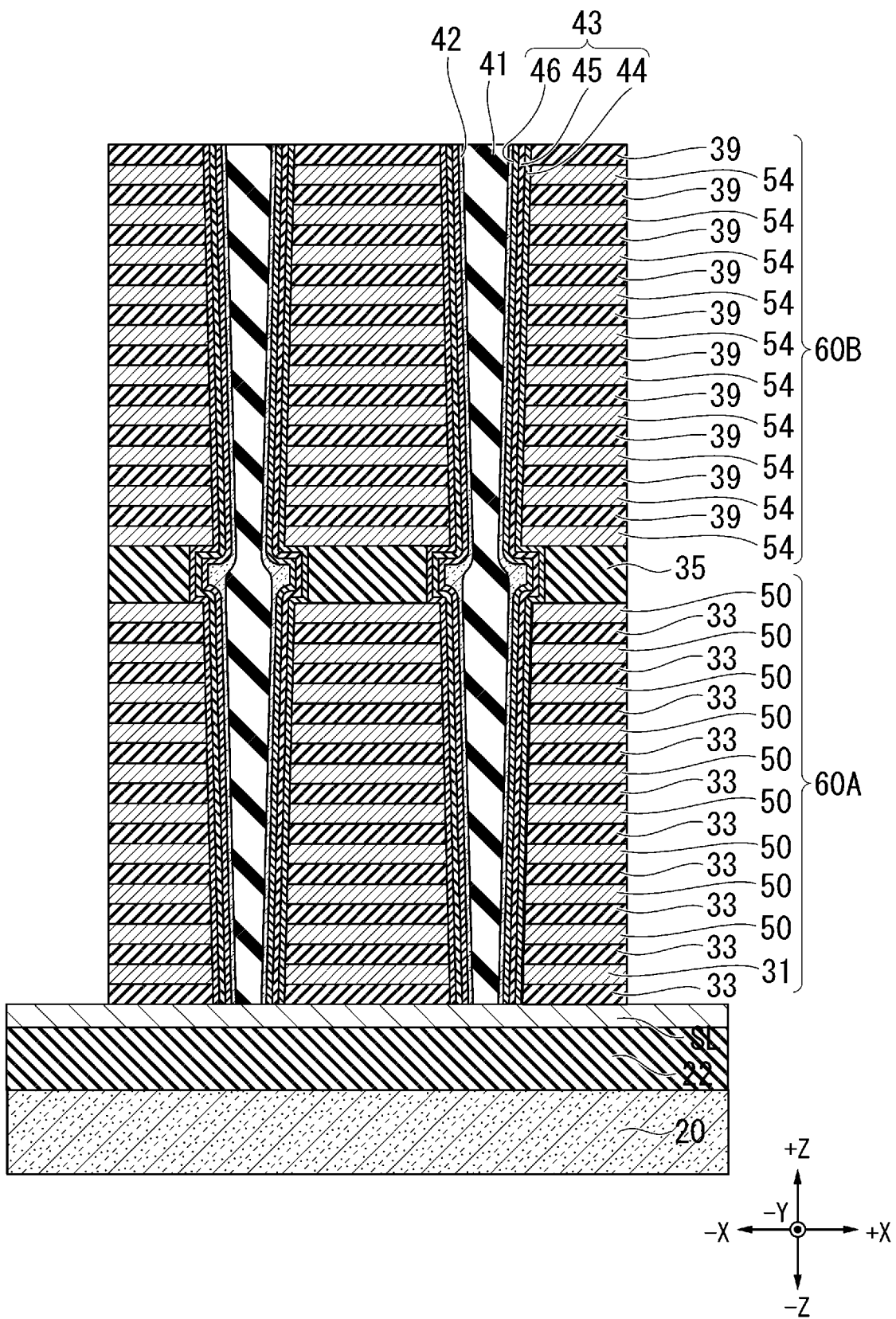
FIG. 20 is a cross-sectional view illustrating an example of a manufacturing process for the memory cell array of the first embodiment.

FIG. 20 is a cross-sectional view corresponding to a core forming process (S21) illustrated in FIG. 6. In the core forming process, first, as illustrated in FIG. 20, the core 41 is formed inside the semiconductor body 42 formed in the semiconductor body forming process S20.

As such, the columnar body 40 is formed inside the first hole LH, the intermediate hole MH, and the second hole UH.

Next, the slits SLT are formed by a slit working process. Accordingly, the plurality of string units SU are distinguished. Then, the sacrifice layers 50 and 54 are removed by wet etching through the slits SLT. Next, the space from which the sacrifice layers 50 and 54 are removed is filled with a conductive material, so that conductive layers 32, 37, and 38 are formed. By the above-described processes, the stacked body 30 and the columnar body 40 are formed.

In the method for manufacturing the memory cell array 10 according to at least one embodiment, the thickness of the intermediate insulating layer 35 is two times or less the average film thickness between the outside surface of the semiconductor body 42 formed in the intermediate hole MH and the inner wall surface of the intermediate hole MH. For example, in the memory film forming process (S19), the thickness of the memory film 43 formed on the inner wall surface of the intermediate hole MH may be two times or less the thickness of the intermediate insulating layer 35. It is preferable that the memory film 43 formed on the inner wall surface of the intermediate hole MH has a thickness that allows the portions expanded from the first hole LH and the second hole UH to be filled with the memory film 43.

In the above-described method for manufacturing the semiconductor memory 1, the sacrifice layers 50 and 54 are used in the first stacked precursor 60A and the second stacked precursor 60B, but the disclosure is not limited thereto. For example, conductive layers may be used instead of the sacrifice layers 50 and 54. Here, a process of removing the sacrifice layer and filling with a conductive material becomes unnecessary.

In the semiconductor memory 1 according to the embodiment described above, the width of the intermediate columnar portion 40C in the direction intersecting the stacking direction of the semiconductor body 42 is the shortest at the upper end 40C2 of the intermediate columnar portion 40C and the longest at the lower end 40C1 of the intermediate columnar portion 40C. Accordingly, since the occurrence of breakage of the semiconductor body 42 can be prevented, it is possible to prevent the operation failure of the semiconductor memory 1. The reason why the occurrence of breakage of the semiconductor body 42 can be prevented is not necessarily clear, but the reason is considered as follows.

In the semiconductor memory 1 provided with the intermediate insulating layer 35 between the first stacked body 30A and the second stacked body 30B, it is common to increase the size of the holes formed in the intermediate insulating layer 35 in comparison with the first stacked body 30A and the second stacked body 30B. Here, a step difference is formed at the upper end and the lower end of the intermediate hole MH. When the memory film 43 and the semiconductor body 42 are sequentially formed on the inner wall surface of the intermediate hole MH in a state of having the step difference, the thickness of the semiconductor body 42 becomes excessively small at an edge portion of the step difference, so that the semiconductor body 42 may be broken. The thinning of the semiconductor body 42 at the edge portion of the step difference tends to occur particularly when slimming the semiconductor body 42. In at least one embodiment, since the semiconductor body 42 is slimmed so that the width of the semiconductor body 42 in the direction intersecting the stacking direction is the shortest at the upper end 40C2 of the intermediate columnar portion 40C and the longest at the lower end 40C1 of the intermediate columnar portion 40C, the semiconductor body 42 is less likely to be excessively thinned at the edge portion of the step difference. Therefore, the semiconductor body 42 is less likely to be broken.

In the semiconductor memory 1 according to at least one embodiment, the width of the semiconductor bodies 42 in the direction intersecting the stacking direction may be increased as the semiconductor body 42 approaches from the upper end 40C2 to the lower end 40C1 of the intermediate columnar portion 40C. Here, since the surface shape of the semiconductor body 42 becomes smooth, the semiconductor body 42 is less likely to be broken.

In the semiconductor memory 1 according to at least one embodiment, the width of the intermediate columnar portion in the direction intersecting the stacking direction of the charge storage film may be maximum at a portion other than the upper end and the lower end of the intermediate columnar portion.

In the semiconductor memory 1 according to at least one embodiment, the thickness t3 of the intermediate insulating layer 35 in the stacking direction may be two times or less the average film thickness (that is, the average film thickness of the memory film 43) between the outside surface of the semiconductor body in the intermediate columnar portion 40C and the outside surface of the intermediate columnar portion. Here, since the thickness t3 of the intermediate insulating layer 35 in the stacking direction becomes small, after the memory film 43 is formed, the shape becomes smooth, that is, the inner peripheral length of the intermediate insulating layer 35 increases monotonically as the intermediate insulating layer 35 approaches from the upper end 40C2 to the lower end 40C1. Accordingly, the thickness of the semiconductor body 42 is less likely to be excessively small.

In the semiconductor memory 1 according to the embodiment, the thickness t3 of the intermediate insulating layer 35 in the stacking direction may be 30 nm or less. Here, since the thickness t3 of the intermediate insulating layer 35 in the stacking direction is as small as 30 nm or less, after the memory film 43 is formed, the shape becomes smooth, that is, the inner peripheral length of the intermediate insulating layer 35 increases monotonically as the intermediate insulating layer 35 approaches from the upper end 40C2 to the lower end 40C1. Accordingly, the thickness of the semiconductor body 42 is less likely to be excessively small.

In the semiconductor memory 1 according to at least one embodiment, the outer peripheral length of the lower end 40C1 of the intermediate columnar portion 40C may be larger than the outer peripheral length of the upper end 40A2 of the first columnar portion 40A, and the outer peripheral length of the upper end 40C2 of the intermediate columnar portion 40C may be smaller than the outer peripheral length of the lower end 40B1 of the second columnar portion 40B. Here, since the intermediate columnar portion 40C is larger than the first columnar portion 40A and the second columnar portion 40B in the X and Y directions, the first columnar portion 40A and the second columnar portion 40B are easily connected to each other via the intermediate columnar portion 40C.

In the semiconductor memory 1 according to at least one embodiment, the outer peripheral length of the lower end 40B1 of the second columnar portion 40B may be smaller than the outer peripheral length of the upper end 40A2 of the first columnar portion 40A. Here, since the second columnar portion 40B can be more easily connected than the intermediate columnar portion 40C, the first columnar portion 40A and the second columnar portion 40B can be more easily connected via the intermediate columnar portion 40C.

In the method for manufacturing the semiconductor memory 1 according to at least one embodiment, the thickness t3 of the intermediate insulating layer 35 is set to two times or less the average film thickness between the outside surface of the semiconductor body 42 formed in the intermediate hole MH and the inner wall surface of the intermediate hole MH. Accordingly, the thickness t3 of the intermediate insulating layer 35 in the stacking direction becomes small, and the distance between the step differences of the upper end and the lower end of the intermediate hole MH is shortened. Therefore, the width of the obtained semiconductor memory 1 in the direction intersecting the stacking direction of the semiconductor bodies 42 in the intermediate columnar portion 40C becomes the shortest at the upper end 40C2 of the intermediate columnar portion 40C and becomes the longest at the lower end 40C1 of the intermediate columnar portion 40C, and the thickness of the semiconductor body 42 is less likely to be excessively small at the edge portion of the step difference.

In the semiconductor memory 1 according to at least one embodiment, the thickness t3 of the intermediate insulating layer 35 of the memory cell array and the thickness of the intermediate columnar portion 40C in the stacking direction are the same. However, the relationship between the thickness t3 of the intermediate insulating layer 35 and the thickness of the intermediate columnar portion 40C is not limited to the above described one. That is, as long as the intermediate insulating layer 35 has a region in which the intermediate columnar portion 40C is formed, the total thickness of the intermediate insulating layer 35 may be larger than the thickness of the intermediate columnar portion 40C. Here, the thickness of the intermediate columnar portion 40C in the stacking direction may be two times or less the average film thickness between the outside surface of the semiconductor body 42 in the intermediate columnar portion 40C and the outside surface of the intermediate columnar portion 40C. The thickness of the intermediate columnar portion 40C in the stacking direction may be 30 nm or less. An example of a memory cell array having such a configuration is illustrated in FIG. 21.

Figure 21:
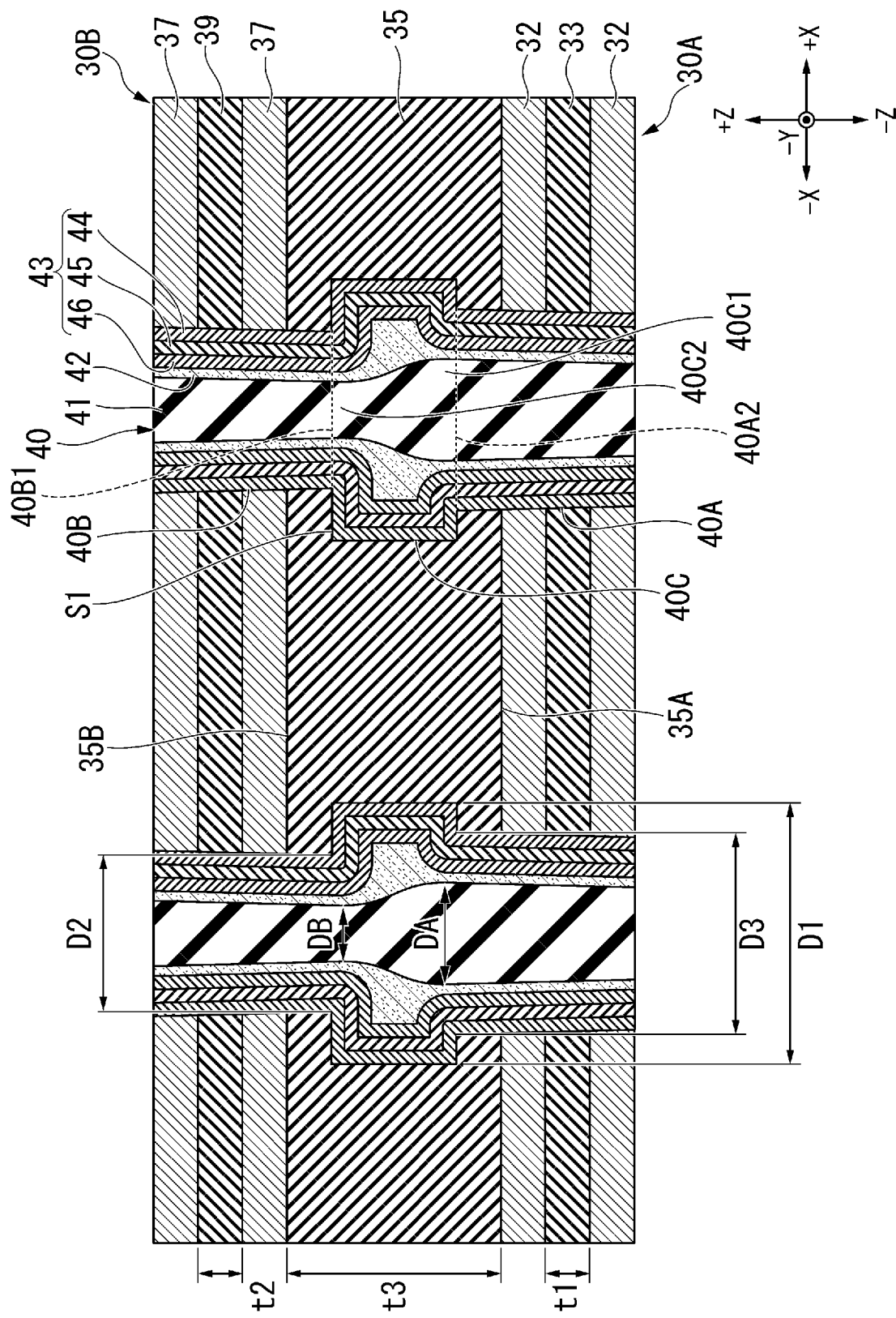
FIG. 21 is a cross-sectional view illustrating a region near an intermediate columnar portion of a memory cell array according to a first modification.

FIG. 21 is a cross-sectional view illustrating a region near an intermediate columnar portion of a memory cell array according to a first modification.

In the first modification illustrated in FIG. 21, the thickness t3 of the intermediate insulating layer 35 in the stacking direction is different from that of the first embodiment. In the first modification, the thickness t3 of the intermediate insulating layer 35 is larger than the thickness of the intermediate columnar portion 40C. That is, the intermediate insulating layer 35 includes a connecting portion connecting the intermediate columnar portion 40C and the first columnar portion 40A and a connecting portion connecting the intermediate columnar portion 40C and the second columnar portion 40B. The thickness t3 of the intermediate insulating layer 35 may be in a range of, for example, 1.1 times or more and 3.0 times or less the thickness of the intermediate columnar portion 40C. Since the other configurations of the first modification are the same as those of the first embodiment, the other configurations are denoted by the same reference numerals, and the description will be omitted. It is noted that, in the first modification, the intermediate columnar portion 40C is located in the center of the intermediate insulating layer 35, but the lower end of the intermediate columnar portion 40C may be located to be horizontal to the lower end of the intermediate insulating layer 35, and the upper end of the intermediate columnar portion 40C may be located to be horizontal to the upper end of the intermediate insulating layer 35.

The intermediate insulating layer 35 of the first modification may be formed, for example, as follows.

In the intermediate hole forming process (S14), holes having the same diameter as the first hole LH are formed in the intermediate insulating layer 35 stacked in the intermediate insulating layer stacking process (S13). Next, a hole expanded from the first hole LH is formed at a position above the lower end of the intermediate insulating layer 35 in the X direction and the Y direction. As such, the intermediate hole MH having a hole for forming the intermediate columnar portion 40C and a hole for forming a connecting portion connecting the intermediate columnar portion 40C and the first columnar portion 40A is formed in the intermediate insulating layer.

Next, in the intermediate sacrificial material forming process (S15), the intermediate sacrificial material 52 is formed inside the intermediate hole MH.

Next, before performing the second stacking process (S16), the intermediate insulating layer 35 for forming a connecting portion connecting the intermediate columnar portion 40C and the second columnar portion 40B is formed on the intermediate insulating layer 35 on which the intermediate sacrificial material 52 is formed. Then, the second stacking process (S16) is performed to produce the second stacked precursor 60B on the intermediate insulating layer 35.

Next, in the second hole forming process, the second hole UH is formed in the second stacked precursor 60B, and the hole for forming a connecting portion of connecting the intermediate columnar portion 40C and the second columnar portion 40B is formed in the intermediate insulating layer 35. After that, the sacrificial material removing process (S18), the memory film forming process (S19), the semiconductor body forming process (S20), and the core forming process (S21) are performed in this order.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a first stacked body including a plurality of conductive layers and a plurality of insulating layers that are alternately stacked;
   a second stacked body being located above the first stacked body and including a plurality of conductive layers and a plurality of insulating layers that are alternately stacked;
   an intermediate insulating layer being located between the first stacked body and the second stacked body, the intermediate insulating layer having a thickness in the stacking direction larger than that of one of the plurality of insulating layers of the first stacked body; and
   a plurality of columnar bodies provided over the first stacked body and the second stacked body, each columnar body including a core, a charge storage film provided between at least one of the plurality of conductive layers and the core, and a semiconductor body provided between the charge storage film and the core, wherein
   each of the plurality of columnar bodies includes (i) a first columnar portion formed in the first stacked body, (ii) an intermediate columnar portion formed in the intermediate insulating layer, and (iii) a second columnar portion formed in the second stacked body, and
   wherein a width of the semiconductor body in the intermediate columnar portion in a direction intersecting the stacking direction is (i) relatively thinnest at an upper end of the intermediate columnar portion, and (ii) relatively thickest at a lower end of the intermediate columnar portion.

2. The semiconductor storage device according to claim 1, wherein the width of the intermediate columnar portion in the direction intersecting the stacking direction of the semiconductor body increases from the upper end to the lower end of the intermediate columnar portion.

3. The semiconductor storage device according to claim 1, wherein the intermediate columnar portion in the direction intersecting the stacking direction of the charge storage film has a maximum thickness at a portion other than the upper end and the lower end of the intermediate columnar portion.

4. The semiconductor storage device according to claim 1, wherein the thickness of the intermediate columnar portion in the stacking direction is two times or less than an average film thickness between an outside surface of the semiconductor body and an outside surface of the intermediate columnar portion in the intermediate columnar portion.

5. The semiconductor storage device according to claim 1, wherein the thickness of the intermediate columnar portion in the stacking direction is 30 nm or less.

6. The semiconductor storage device according to claim 1, wherein
an outer peripheral length of a lower end of the intermediate columnar portion is larger than an outer peripheral length of an upper end of the first columnar portion, and
an outer peripheral length of an upper end of the intermediate columnar portion is larger than an outer peripheral length of a lower end of the second columnar portion.

7. The semiconductor storage device according to claim 1, wherein the outer peripheral length of the lower end of the second columnar portion is smaller than the outer peripheral length of the upper end of the first columnar portion.

8. A method for manufacturing a semiconductor storage device, the method comprising:
alternately stacking a sacrifice layer or a conductive layer and an insulating layer to produce a first stacked precursor;
forming a first hole inside the first stacked precursor;
forming a sacrificial material in the first hole of the first stacked precursor;
stacking an intermediate insulating layer on the first stacked body precursor;
forming an intermediate hole in the intermediate insulating layer;
forming a sacrificial material in the intermediate hole of the intermediate insulating layer;
alternately stacking a sacrifice layer or a conductive layer and an insulating layer on the intermediate insulating layer to produce a second stacked precursor;
forming a second hole inside the second stacked precursor;
removing the sacrificial material formed in the first hole and the sacrificial material formed in the intermediate hole; and
forming a charge storage film, a semiconductor body, and a core in order on inner wall surfaces of the first hole, the intermediate hole, and the second hole, wherein
a thickness of the intermediate insulating layer is two times or less than an average film thickness between (i) an outside surface of the semiconductor body formed on the inner wall surface of the intermediate hole and (ii) the inner wall surface of the intermediate hole.

9. The semiconductor storage device according to claim 1, wherein the semiconductor storage device includes a NAND memory.

10. The semiconductor storage device according to claim 1, wherein the conductive layers include WORD lines.

11. The semiconductor storage device according to claim 1, wherein the core includes silicon oxide.

12. The semiconductor storage device according to claim 1, wherein the charge storage film includes silicon nitride.

13. The semiconductor storage device according to claim 1, wherein the semiconductor body includes polysilicon.

14. The semiconductor storage device according to claim 2, wherein the width of the intermediate columnar portion in the direction intersecting the stacking direction of the semiconductor body does not decrease as the semiconductor body goes from the upper end to the lower end of the intermediate columnar portion.

15. The method according to claim 8, wherein the first and second holes are formed by an anisotropic etch.

* * * * *